(12) United States Patent
Nakamura et al.

(10) Patent No.: US 7,585,783 B2
(45) Date of Patent: Sep. 8, 2009

(54) DROP DISCHARGE APPARATUS, METHOD FOR FORMING PATTERN AND METHOD FOR MANUFACTURING SEMICONDUCTOR DEVICE

(75) Inventors: Osamu Nakamura, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 477 days.

(21) Appl. No.: 10/827,710

(22) Filed: Apr. 20, 2004

(65) Prior Publication Data
US 2006/0158482 A1 Jul. 20, 2006

(30) Foreign Application Priority Data
Apr. 25, 2003 (JP) ............... 2003-121638

(51) Int. Cl.
*H01L 21/31* (2006.01)
(52) U.S. Cl. .............. 438/758; 438/761; 438/763; 257/E21.476
(58) Field of Classification Search .......... 438/674, 438/676, 677, 758, 761, 763; 257/E21.476
See application file for complete search history.

(56) References Cited

U.S. PATENT DOCUMENTS

| | | | |
|---|---|---|---|
| 5,512,514 A * | 4/1996 | Lee .............. | 438/626 |
| 6,313,435 B1 | 11/2001 | Shoemaker et al. | |
| 6,503,831 B2 * | 1/2003 | Speakman ......... | 438/674 |
| 6,630,274 B1 * | 10/2003 | Kiguchi et al. ....... | 430/7 |
| 6,673,680 B2 * | 1/2004 | Calafut ............. | 438/270 |
| 6,715,871 B2 | 4/2004 | Hashimoto et al. | |
| 6,810,814 B2 * | 11/2004 | Hasei .............. | 101/485 |
| 6,957,608 B1 * | 10/2005 | Hubert et al. ....... | 101/483 |
| 2001/0045974 A1 | 11/2001 | Shoemaker et al. | |
| 2003/0030689 A1 | 2/2003 | Hashimoto et al. .... | 347/20 |
| 2003/0083203 A1 * | 5/2003 | Hashimoto et al. .... | 505/100 |
| 2005/0043186 A1 | 2/2005 | Maekawa et al. | |
| 2005/0142896 A1 | 6/2005 | Imai et al. | |

FOREIGN PATENT DOCUMENTS

CN     1297576     5/2001

(Continued)

OTHER PUBLICATIONS

International Search Report (Application No. PCT/JP2004/005393) Dated Aug. 10, 2004 (In Japanese).

(Continued)

*Primary Examiner*—Alexander G Ghyka
*Assistant Examiner*—Angel Roman
(74) *Attorney, Agent, or Firm*—Cook Alex Ltd.

(57) ABSTRACT

In this invention, it provides a method for forming a pattern, which is capable of improving position control after a drop, which was discharged from a drop discharge apparatus, was landed on a substrate. In addition, it provides a drop discharge apparatus which is capable of improving drop position accuracy after it was landed. Further, it provides a method for manufacturing a semiconductor device which uses the drop discharge apparatus of this invention.

This invention is characterized in that a drop which was discharged from a discharge part, or a substrate on which a drop is landed, is irradiated with a laser beam, and a landing position of a drop is controlled. By this invention, it is possible to form a pattern, without using a photolithography process.

26 Claims, 15 Drawing Sheets

FOREIGN PATENT DOCUMENTS

| | | |
|---|---|---|
| CN | 1326394 | 12/2001 |
| EP | 1087428 | 3/2001 |
| EP | 1087428 A1 * | 3/2001 |
| JP | 08062445 A * | 3/1996 |
| JP | 2001-179167 | 7/2001 |
| JP | 2001 179167 | 7/2001 |
| JP | 2003 080694 | 3/2003 |
| WO | WO 00/30799 A1 | 6/2000 |
| WO | WO 00 59014 | 10/2000 |

OTHER PUBLICATIONS

Written Opinion (Application No. PCT/JP2004/005393) Dated Aug. 10, 2004 (Partial Translation).

Office Action re Chinese patent application No. CN 200480011134.8, dated May 18, 2007 (with English translation).

* cited by examiner (A)

(B)

(A)

(B)

(C)

(D)

(A)

(B)

(C)

(A)

(B)

(C)

(A)

(B)

(C)

(A)

(B)

(C)

DROP DISCHARGE APPARATUS, METHOD FOR FORMING PATTERN AND METHOD FOR MANUFACTURING SEMICONDUCTOR DEVICE

TECHNICAL FIELD

This invention relates to a drop discharge apparatus which is used for pattern formation of a semiconductor device. In addition, it relates to a method for forming a patter which is manufactured by use of the drop discharge apparatus according to this invention and a method for manufacturing a semiconductor device.

BACKGROUND OF THE INVENTION

A drop-on-demand type drop discharge technology, which is typified by a piezo type and a thermal jet type, or a continuous type drop discharge technology is gathering attention. This drop discharge technology has been used for depiction of types, images, but in these years, trials for applying this drop discharge technology to a semiconductor field such as fine pattern formation, a bio, medical field such as DNA chip fabrication, a chemical, medical field such as micro-chemical chip fabrication have been started.

As advantages in case of utilizing the drop discharge technology for a semiconductor field, cited are such matters that large area patterning and high-resolution patterning are easy, and simplification of semiconductor fabrication processes is possible, effective utilization of materials is possible, and so on.

SUMMARY OF THE INVENTION

On the occasion of applying the above-described drop discharge method to pattern formation of a semiconductor field, excessive drop landing accuracy is required beyond that needed, for depiction of types and images. In particular, in an image display device which is configured by TFT formed by an amorphous semiconductor film (amorphous silicon TFT) and TFT formed by a crystalline semiconductor film (polysilicon TFT), fluctuation of sizes of patterns and location accuracy of patterns influence great deal to an image display characteristic, and cause display irregularity and display defect.

Against the above-described problem, a performance of the drop discharge apparatus itself is improved significantly. That is, by semiconductor fine fabrication using a photolithography process and a focused ion beam, a high-precision drop discharge apparatus is manufactured, and fluctuation of sizes of discharged drops and fluctuation of discharge angles, due to the apparatus, are getting smaller.

On one hand, with regard to position control after drops, which were discharged from a drop discharge apparatus, landed on a substrate to be processed, sufficient measures have not found. In case that the landed drops are of liquid-shedding to a surface of the substrate to be processed, a contact angle of the drops and the substrate is large, and the drops easily roll on the substrate. Inversely, when the landed drops is of liquid-attracting to the surface of the substrate to be processed, and the contact angle of the drops and the substrate is small, the drops after they were landed easily stretch out on the substrate, and it is difficult to control diameters of drops after they were landed, and fluctuation of drop diameters after they were solidified is large.

In this invention, it provides a method for forming a pattern, in which it is possible to improve position control after drops, which were discharged from a drop discharge apparatus, were landed on a substrate. In addition, it provides a drop discharge apparatus by which it is possible to improve drop location accuracy after they were landed. Further, it provides a method for manufacturing a semiconductor device which uses a drop discharge apparatus of this invention.

In order to solve the above-described problem, in this invention, taken are the following means which improve landing accuracy of drops which were discharged from a drop discharge apparatus to a surface of a substrate to be processed by using a laser beam.

As first means, in such a moment that a drop was landed on a substrate to be processed, the drop is irradiated with a laser beam, and a solvent component in the drop is evaporated at short times, and solidification of a drop composition (solute) is facilitated. By terminating solidification before the landed drop rolls or stretches out wetly, it is possible to improve landing location accuracy. It is desirable that, by carrying out a series of drop discharge processes under reduced pressure of a level of $10^{-2}$ Pa to $10^4$ Pa, solidification is expedited, and a solvent component is effectively exhausted.

As second means, by irradiating a surface of the substrate to be processed with a laser beam, a laser abrasion process is applied to an irradiation part, and a groove is formed on the substrate to be processed, and a drop is discharged in this groove. By enlarging a width of the groove more than a diameter of a flying drop, and a stretch diameter of a drop after it was landed on the substrate to be processed, it is difficult to receive influence of fluctuation of discharge positions due to fluctuation of flying angles, shapes of nozzles of drop discharge apparatuses, and it is possible to accommodate a drop after it was landed in an inside of the groove. That is, it is possible to form a pattern over preventing a drop from stretching out to an outside of the groove on the substrate.

As third means, by irradiating a surface of the substrate to be processed with a laser beam, it generates a chemical change or thermal change on an irradiation part to form concavity and convexity, and surface property modification for heightening adhesion with drops is carried out. On this occasion, it is desirable that the substrate to be processed is of liquid-shedding to a drop which is discharged, and it is possible to flip a drop which is about to run over to an outside of a region which was irradiated with a laser beam, and it is possible to form a pattern over preventing drops from stretching out on the substrate.

As fourth means, discharge of a drop is carried out by a drop discharge apparatus on a surface of a substrate to be processed, and a solvent component in the drop is evaporated, and after it was solidified, irradiation of a laser beam is carried out. A solute component, after it became in a molten state by laser irradiation, is solidified again, or re-crystallized, to form a pattern. By such a matter that a contact boundary face of dot shaped patterns, which were formed by a plurality of drop discharges, is liquefied by laser irradiation, the dot shaped patterns are connected so that it is possible to form a continuous pattern.

Here, the pattern includes a gate wiring, a source wiring, a wiring which connects TFT and pixel electrodes, a gate electrode, an active layer having a semiconductor material as a principal component, an organic light emitting layer, a resist mask, an insulating layer, and so on.

In addition, the laser beam is not necessarily a thing which is specialized only to coherent light which is generated by a laser oscillator, but it is possible to improve landing accuracy of drops, even by light which is emitted from a UV lamp, a halogen lamp, a flash lamp and so on, by the same method as in irradiating a laser beam.

Without limiting the first means, by placing processing atmosphere under reduced pressure of a level of $10^{-2}$Pa to $10^4$Pa, solidification is expedited, and a solvent component can be effectively removed. In addition, by simultaneously using the first to the third means and the fourth means, it is also possible to carry out formation of a pattern. Further, by planarizing a pattern of a component (solute) of drops, which was formed by use of drop discharge means, by use of a roller, it is possible to heighten adhesion of an object to be processed and a drop composition.

In addition, this invention contains the following configuration.

This invention is a drop discharge apparatus which is characterized by having means which discharges a drop, and means which modifies a property of a drop which was discharged from the means which discharges a drop. The means which modifies a property of a drop is means which evaporates a solvent of the drop, or means which re-crystallizes a solute of the drop.

In addition, this invention is a drop discharge apparatus which is characterized by having means which discharges a drop, and means which modifies a property of a surface of an object to be processed on which the drop is dropped. The means which modifies a property of a surface of the object to be processed is means which forms a groove in the object to be processed, or means which forms a convexo-concave region on the substrate.

As the means which discharges a drop, it is representatively a thing which discharges a drop by use of a piezoelectric element or a heating element, and it discharges a drop from a discharge outlet (nozzle, head). In addition, as the means which modifies a property of a drop and the means which modifies a property of a surface of a substrate on which the drop is dropped, cited are a laser oscillator which irradiates a laser beam, a UV lamp which emits strong light and a halogen lamp, a flash lamp and so on.

As the laser oscillator, a gas laser oscillator, a solid-state laser oscillator, a metal laser oscillator, or a semiconductor laser oscillator can be used. In addition, between the laser oscillator and the object to be processed, means which adjust a beam shape or a beam pathway of the laser beam which is emitted from the laser oscillator, can be used. In passing, as a representative example of the means which adjust a beam shape or a beam pathway of the laser beam which is emitted from the laser oscillator, there is a micro lens array.

In addition, it may also have a moving device which changes a relative position of the means which discharges a drop and the object to be processed. Further, it may also have a control device which controls a landing position of the drops and an irradiation position of the laser beam which is emitted from the laser oscillator.

In addition, this invention is a method for forming a pattern, which is characterized in that a drop is discharged from discharge means, and the drop is irradiated with a laser beam when the drops land on a surface to be processed, and a solvent of the drop is evaporated, to form a pattern.

In addition, this invention is a method for forming a pattern, which is characterized in that after a surface to be processed was irradiated with a laser beam and a groove was formed in the surface to be processed, a drop is discharged from discharge means, and the drop is landed in the groove, to form a pattern.

In addition, this invention is a method for forming a pattern, which is characterized in that, after a surface to be processed was irradiated with a laser beam and a convexo-concave region was formed on the surface to be processed, a drop is discharged from discharge means, and the drop is landed on the convexo-concave region, to form a pattern.

In addition, this invention is a method for forming a pattern, which is characterized in that, after a drop was discharged form discharge means and the drop was landed on a surface to be processed and a solvent of the drop was evaporated, it is irradiated with a laser beam and the solute of the drop is re-crystallized, to form a pattern.

The drop can be discharged under reduced pressure atmosphere, or barometric pressure atmosphere. In addition, after the pattern was formed, the pattern may be planarized. Further, by synchronizing such time that the drop is landed, with such time that the surface to be processed is irradiated with the laser beam, it is possible to further heighten location accuracy of patterns.

In addition, this invention is a method for manufacturing a semiconductor device, in which the semiconductor device is manufactured by use of the above-described pattern forming method. In addition, in this case, as the drop, used are an electrically conductive material, a resist material, a light emitting material, or liquid having semiconductor nano-particles, etching solution and so on.

This invention includes a semiconductor device which is manufactured by use of the above-described drop discharge apparatus, and a method for manufacturing the same. In addition, it can also be preferably utilized for application to a field other than a semiconductor field, i.e., bio, scientific, medical fields.

By a drop discharge method using a laser beam, it becomes possible to dramatically improve pattern accuracy, and as a result of that, it becomes possible to directly draw design data, without using a photolithography process. Design and manufacture of photo masks become unnecessary, and in addition, manufacturing processes are simplified, and a production cost is reduced, and in addition, a yield ratio of products is improved.

In addition, utilization efficiency of materials is improved substantially, and a waste liquid treatment amount is reduced, and a process, which is friendly to the environment, is realized.

Further, even comparing with a screen printing, development to a large size substrate is easy, and it is possible to lower product unit price, and it is possible to maintain high-resolution pattern formation, and to form a pattern with high utilization efficiency of materials.

DETAILED DESCRIPTION OF THE PRESENTLY PREFERRED EMBODIMENTS

Embodiment modes of this invention will be explained in detail by use of drawings. In this regard, however, this invention is not limited to the following explanations, and it is easily understood to persons with skill in the art to be able to change variously, without departing from a theme of this invention and a scope thereof, the modes and details. Therefore, this invention is not a thing which is interrupted to be limited to a description content of embodiment modes which are shown below.

Embodiment Mode 1

Figure 1:
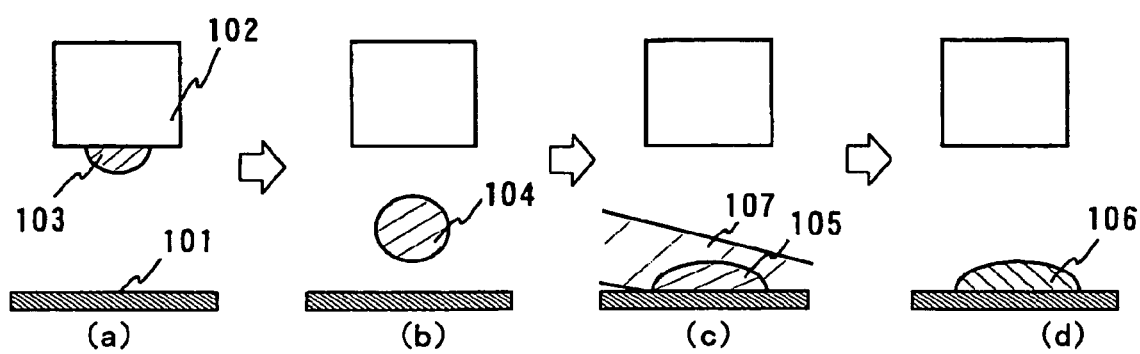
FIG. 1 is a view which typically shows a drop discharge method of this invention, in which landing accuracy was improved.

By use of FIGS. 1 to 4, a method for manufacturing a semiconductor device by use of a drop discharge apparatus in which pattern accuracy was heightened by carrying out irradiation of a laser beam will be explained. FIG. 1 typically shows a positional relationship in case that a substrate 101 to be processed and a front edge 102 of a drop discharge part and a drop 103 were viewed from the side. The drop discharge part is composed of a piezoelectric element (piezo element), a drop chamber, a discharge outlet (nozzle, head) and so on, and by applying a predetermined pulse voltage to the piezo element, the piezo element is deformed, to apply pressure to the drop chamber, and a drop is discharged from the discharge outlet.

As a drop to be discharged, used is a thing in which an electrically conductive material, which was properly selected from an element selected from tantalum (Ta), tungsten (W), titanium (Ti), molybdenum (Mo), aluminum (Al), copper (Cu), chromium (Cr), niobium (Nb), or alloy materials or chemical materials having the above-described element as a principal component, AgPdCu alloy etc., was dissolved or dispersed in a solvent. As the solvent, used are an esters such as butyl acetate and ethyl acetate, an alcohols such as isopropyl alcohol and ethyl alcohol, an organic solvent such as methyl ethyl ketone and acetone. A concentration of a solvent may be properly determined according to a type of an electrically conductive material. In addition, a resist material, a light emitting material and so on can be also used.

A nozzle diameter of the drop discharge part is several μm to several dozen μm, and is dependent on viscosity, surface tension, discharge speed etc. of a drop, and a diameter of a drop to be discharged becomes approximately the same level. It is preferable that an amount of a composition which is discharged one time is 1 to 100 pl, and viscosity is 100 cp or less, and diameters of particles which configure a drop are 0.1 μm or less. This is because occurrence of drying is prevented, and in addition, because a composition can not be discharged smoothly from the discharge outlet, if viscosity is too high. In tune with a solvent which is used, and intended use, viscosity, surface tension, drying speed etc. of a composition is properly adjusted. In this regard, however, in case of forming a fine pattern such as a wiring, a drop of femto-little order or, sub-femto little becomes necessary, there is a necessity to use a corresponded drop discharge apparatus.

In addition, although it is not shown in the figure, temperature control of a drop is important, and by incorporating a heater, control of a drop discharge apparatus and substrate temperature is carried out. It is preferable that a composition, which is discharged from a drop discharge apparatus, is dropped continuously on a substrate to form a line shape or a stripe shape. However, for example, it may be dropped with respect to each predetermined place such as with respect to each 1 dot.

A drop 104, which was pushed out from the drop discharge part, flied in a space between the front edge 102 of the drop discharge part and the substrate 101 to be processed, and thereafter, is landed on the substrate 101 to be processed, to become a drop 105. At the same time of landing of the drop, the drop 105 is irradiated with a laser beam 107, and solidification of a composition (solute) of the drop is carried out, and a solidified pattern 106 is formed. Since the composition of the drop is solidified at the time of landing, there occurs no case that it moves or stretches out on the substrate to be processed.

Figure 2:
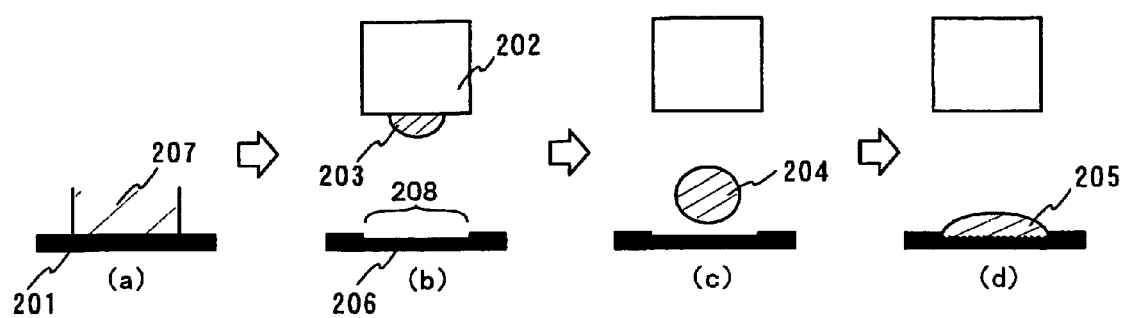
FIG. 2 is a view which typically shows a drop discharge method of this invention, in which landing accuracy was improved.
Figure 3:
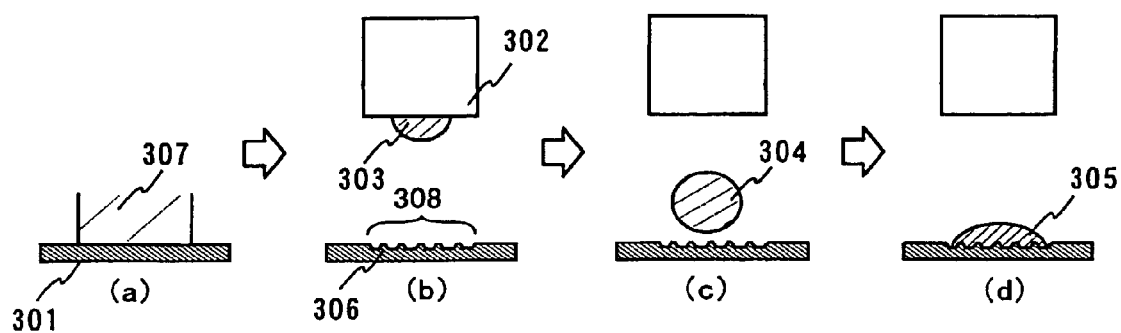
FIG. 3 is a view which typically shows a drop discharge method of this invention, in which landing accuracy was improved.

Next, such a method that the substrate to be processed is irradiated with the laser beam, and then, drip discharge is carried out, will be explained by use of FIG. 2, FIG. 3. Firstly, substrates 201, 301 to be processed are irradiated with laser beams 207, 307, and surface treatment of the substrate to be processed is carried out. In the substrate 206 to be processed of FIG. 2, by laser abrasion, a groove 208 is formed in a surface of the substrate 201 to be processed. In the substrate 306 to be processed of FIG. 3, by laser irradiation, fine convexity and concavity 308 is formed on the substrate 306 to be processed. Next, from drop discharge part front edges 202, 302, drops 203, 303 are discharged, and made to be land in the groove 208 and on the convexity and concavity 308 on the substrate to be processed. By setting diameters of the drops 204, 304, which were pushed out from the drop discharge part, to widths of the groove 208 and the convexity and concavity 308, or less, the drop is landed on a region which was irradiated with laser, with high accuracy, and a composition (solute) of the drop is solidified, and patterns 205, 305 are formed.

Figure 4:
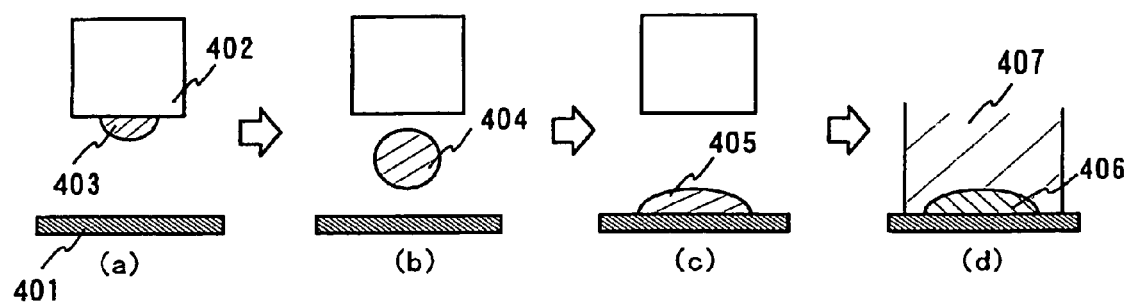
FIG. 4 is a view which typically shows a drop discharge method of this invention, in which landing accuracy was improved.

Next, a method for irradiating a pattern with a laser beam, after drops were discharged on a substrate to be processed by use of a drop discharge apparatus and a pattern was formed, will be explained by use of FIG. 4. From a drop discharge part front edge 402, which is located on a substrate 401 to be processed, a drop 403 is discharged, and the drop 404, which was pushed out, is made to land on the substrate 401 to be processed, and a pattern 405 is formed. For formation of the pattern 405, the means, which was explained in FIG. 1 to FIG. 3, may be used. Further, by irradiating the pattern 405 with a laser beam 407, it is dissolved, and it is possible to obtain a pattern 406 which is re-solidified. By a drop discharge apparatus of this invention, a plurality times of drop discharges are carried out, and compositions (solutes) of drops, which were landed, are overlapped, and thereby, it is possible to form a line shaped pattern and a large area pattern, and by this laser irradiation processing, it is possible to improve continuity of boundary face physicality of each pattern (composition of a drop).

In FIGS. 1 to 4, laser beams 107, 207, 307, 407 are made to be of a predetermined beam shape such as line shape or dot shape, by use of a cylindrical lens and micro lens array, and to be of such a size that entire drops, which were landed, are irradiated. In addition, by a mechanical scanning system according to a polygon mirror, a galvanometer mirror, and so on, an irradiation position of the laser beam is controlled, and it is possible to synchronize irradiation timing with drop discharge. An irradiation position may be controlled by moving the substrate to be processed. Since the laser beam passes through a narrow region between the substrate to be processed and the drop discharge front edge, the laser beam is made to be incident from above the substrate to be processed, from an oblique direction with a low angle from a substrate surface. In case that the substrate to be processed is composed of a material such as glass, through which the laser beam is transmitted, it is possible to enter from a rear surface of the substrate to be processed.

The laser beams 107, 207, 307, 407 can utilize an Ar laser, a Kr laser, an eximer laser, a $CO_2$ laser, a YAG laser, a $Y_2O_3$ laser, a $YVO_4$ laser, YLE laser, $YalO_3$ laser, a glass laser, a ruby laser, a sapphire laser, a semiconductor laser and so on. In tune with a type of a composition (solute), a solvent of a drop, it is possible to select a most appropriate thing.

A size of a processing substrate in the embodiment modes of the invention is 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, or 2200 mm×2600 mm, and the suchlike large area substrate of 2600 mm×3100 mm may be used.

By using the suchlike large area substrate, it is possible to reduce a production cost. As a substrate which can be used, there is a glass substrate such as barium borosilicic acid glass and alumino borosilicic acid glass, which are typified by #7059 glass and #1737 glass of Corning Corporation. Further, as another substrate, it is also possible to use various translucent substrate such as silica, semiconductor, plastic, plastic film, metal, glass epoxy resin, ceramic. In addition, it is also possible to use a resin substrate which is typified by a plastic substrate, and furthermore, a semiconductor wafer such as a N type or P type single crystal silicon substrate, a GaAs substrate, an InP substrate, a GaN substrate, or a ZnSe substrate, a SOI (Silicon On Insulator) substrate etc., an electrically conductive substrate such as a metal plate.

Embodiment Mode 2

One example of a drop discharge apparatus, which is used for carrying out the above-described embodiment mode, will be explained by use of FIG. 5 through FIG. 7.

Figure 5:
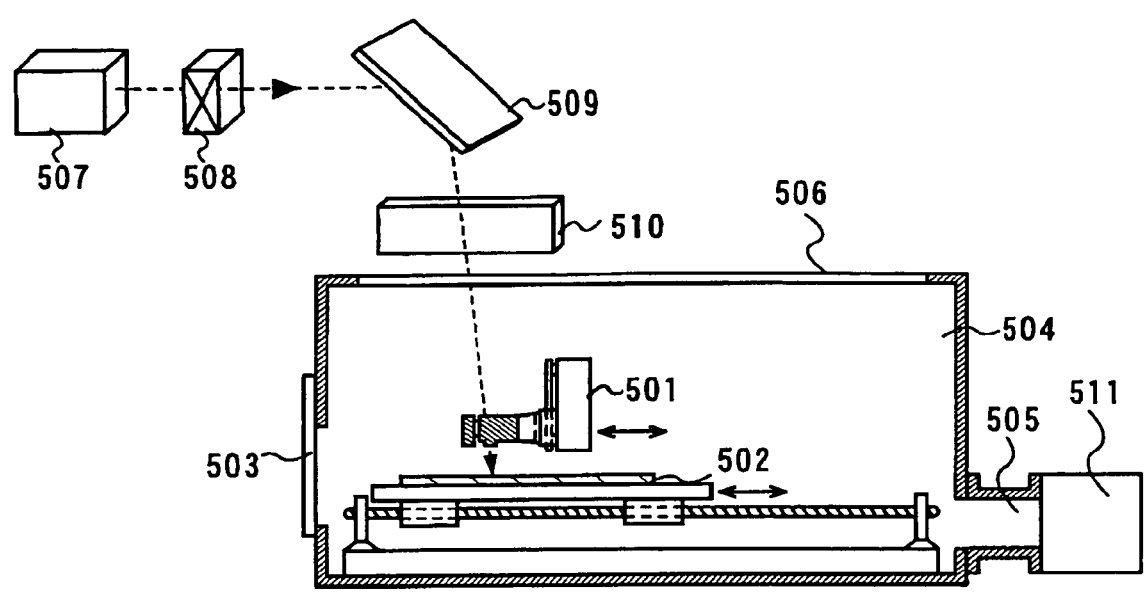
FIG. 5 is a view which shows one example of a drop discharge apparatus which is used on the occasion of implementing this invention.
Figure 6:
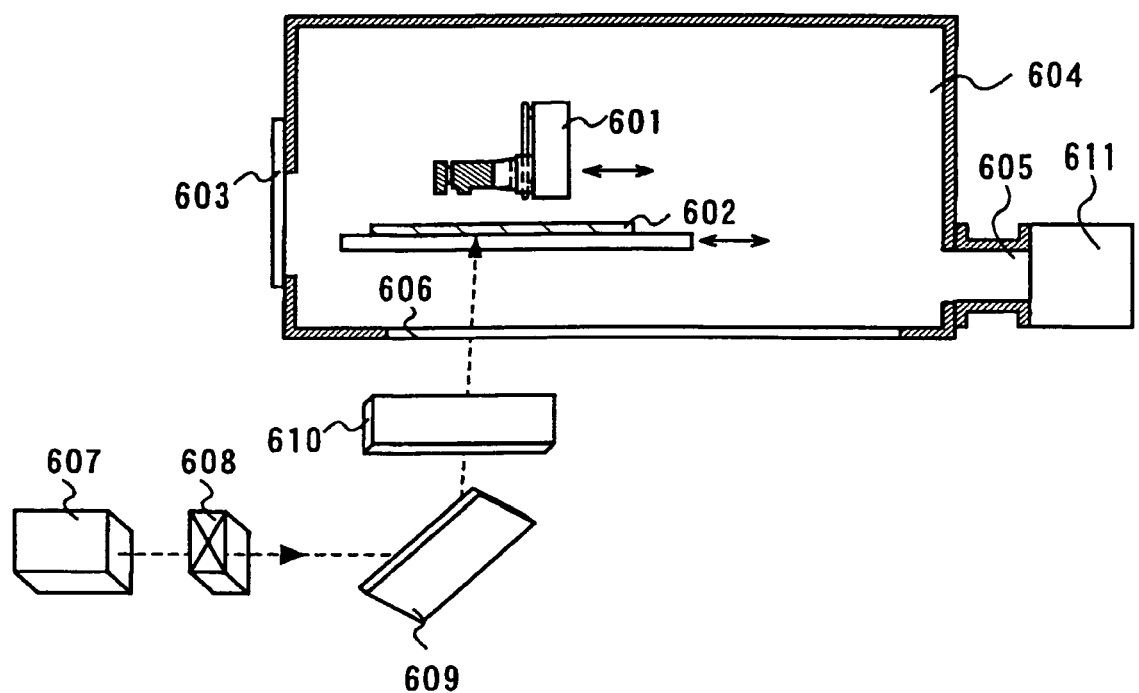
FIG. 6 is a view which shows one example of a drop discharge apparatus which is used on the occasion of implementing this invention.
Figure 7:
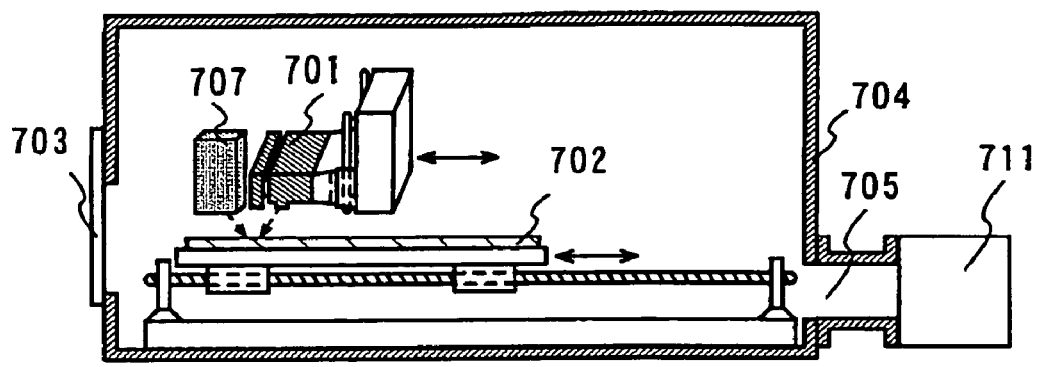
FIG. 7(A) to FIG. 7(B) are views which show one example of a drop discharge apparatus which is used on the occasion of implementing this invention.
Figure 7:
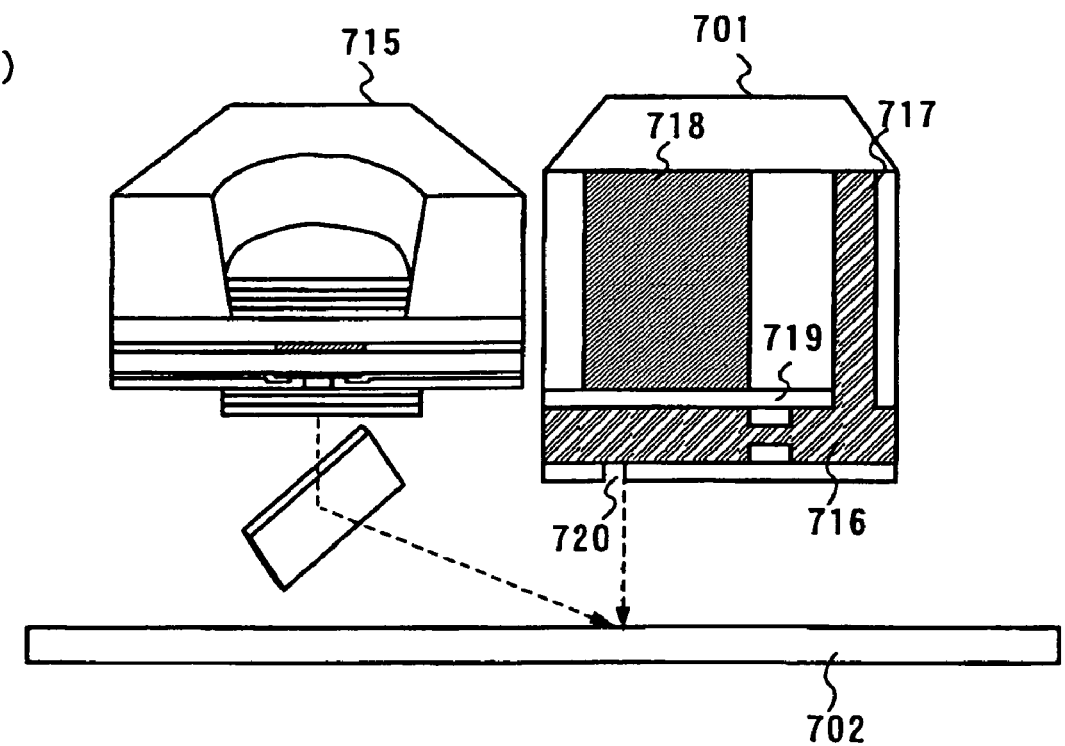

A drop discharge apparatus, which is shown in FIG. 5, FIG. 6, has drop discharge means 501, 601 in the apparatus, and is such a thing that, by discharging solution by this, a desired pattern is formed on substrates 502, 602. Although it is not shown in the figure, in the drop discharge apparatus, a nozzle drive power supply and a nozzle heater for carrying out drop discharge are incorporated, and in addition, it is equipped with moving means for moving drop discharge means. In this drop discharge apparatus, as the substrate 502, 602, the substrates, which were described in the embodiment mode 1, can be applied.

In FIG. 5, FIG. 6, the substrates 502, 602 are carried from carry-in entrances 503, 603 in insides of housings 504, 604. The substrates 502, 602 are located on a transfer table which was equipped with moving means, and can be moved to an arbitrary place in an X-Y plane. Drop discharge processing is started when the substrates 502, 602 reach to such predetermined positions that the drop discharge means 501, 601 have, by movement of the transfer table. The drop discharge processing is accomplished by relative movement of the drop discharge means 501, 601 and the substrates 502, 602, and predetermined timing of drop discharge, and by adjusting moving rate of the means and the substrates and a cycle for discharging drops from the drop discharge means 501, 601, it is possible to draw desired patterns on the substrates 502, 602. In particular, since the drop discharge processing requires high accuracy, it is desirable that movement of the transfer table is stopped at the time of drop discharge, and only the drop discharge means 501, 601, which are of high controllability, are made to scan.

In the above-described housings 504, 604, quartz windows 506, 606 are disposed, and laser beams, which are oscillated from laser oscillators 507, 607 disposed outside the housings, are made to enter from the quartz windows 505, 606. In this regard, however, the housings and the quartz windows are not necessarily required. In a light path of the laser beam, disposed are optical systems 510, 610 which are configured by shutters 508, 608, reflection mirrors 509, 609, cylindrical lenses and so on. In FIG. 5, the laser beam is made to be incident from obliquely above the substrate 502. Since a distance of a drop discharge part front edge of the drop discharge means 501 and the substrate 502 is of a level of several millimeters, it is preferable that the laser beam to be incident is set to 45° or more to a normal line direction of the substrate 502. In FIG. 6, such a case that the laser beam is irradiated from a lower surface of the substrate 602 is typically expressed, and other configuration is the same as FIG. 5. This configuration can be applied to such a case that the substrate 602 is a material through which the laser beam is transmitted.

Further, in order to expedite drying of drops which were landed, and also to remove solvent components of the drops, it is desirable that decompression devices 511, 611 are disposed on exhaust outlets 505, 605 of the housings 504, 604, and vacuum air discharge is carried out, but it is possible that it is carried out under barometric pressure. In addition, although it is not shown in the figure, a sensor for alignment to a pattern on a substrate, means for heating the substrate, and in addition, means for measuring various physicality values such as temperature, pressure, may be disposed according to need. In addition, it is possible to control these means collectively by the control means which were disposed outside the housings 504, 604. Further, if the control means is connected to a production management system etc. by use of a LAN cable, wireless LAN, an optical fiber etc., it becomes possible to manage processes in a single uniform way from outside, which is linked to improvement of productivity.

In FIG. 7(A), an explanation of a drop discharge apparatus which used a semiconductor laser oscillator 707 will be carried out. It is equipped with a housing 704, a carry-in entrance 703, an exhaust outlet 705, a decompression device 711, drop discharge means 701, and characterized in that the semiconductor laser oscillator 707 is used. It is desirable that the semiconductor laser oscillator is configured by a plurality of semiconductor laser arrays, and corresponds to each nozzle of the drop discharge means 701, and in addition, the semiconductor laser oscillator 707 and a drop discharge part of the drop discharge means 701 may be formed integrally. In addition, although it is not shown in the figure, between the semiconductor laser oscillator 707 and a substrate 702, an optical system such as a micro lens array is disposed, and it is possible to adjust a beam shape and a beam pathway. By the above-described configuration, a drop, which was discharged from the drop discharge means 701, is irradiated with a semiconductor laser beam at predetermined timing.

Next, by use of FIG. 7(B), one example of the semiconductor laser oscillator and the drop discharge apparatus are shown. As the laser oscillator, a surface-emitting semiconductor laser oscillator 715 is disposed. A surface-emitting laser can pull out light in a perpendicular direction to a semiconductor substrate, and it is possible to integrate semiconductor laser elements. In the figure, only one surface-emitting semiconductor laser element was typically described, but this semiconductor laser element is disposed as a row in a direction of the back of a page space, to form a semiconductor laser array. On the other hand, the drop discharge part 701 is composed of a solution chamber 716, a solution supply port 717, a piezo element 718, a diaphragm 719, a nozzle 720, and by applying a predetermined pulse voltage to the piezo element, it is possible to discharge a solution from the nozzle 720. In addition, there is a necessity to select the most appropriate waveform which does not generate a satellite as the voltage which is applied to the piezo element.

It is possible to form each of the semiconductor laser element and the drop discharge part by utilizing semiconductor micro-fabrication, and it is possible to integrate a number of semiconductor laser elements and drop discharge parts with a fine interval, and in addition, it is possible to have one semiconductor laser element corresponded to one nozzle. By adjusting an installation angle of an oscillator, or by a mirror, a beam direction is changed, and a drop, which were landed on a surface of the substrate 702, is irradiated with the semiconductor laser beam. Beam adjustment may be carried out by disposing a micro lens array. In addition, means for cooling the semiconductor laser element may be disposed.

In this invention, drop discharge is carried out by a so-called piezo system which used a piezoelectric element, but according to a material of a solution, a so-called thermal ink-jet system, in which a heating element is heated to generate air bubbles and a solution is pushed out, may be used. In this case, it becomes such a configuration that a piezoelectric element is replaced by a heating element. In addition, for the purpose of drop discharge, a wet property of a solution, and a liquid chamber flow channel, an auxiliary liquid chamber, a liquid resistance part, a compression chamber, a solution discharge outlet (nozzle, head) becomes important. On that account, a carbon film, a resin film etc. for adjusting a wet property with a material are formed in each flow channel.

By the above-described apparatus configuration, it is possible to carry out pattern formation on a substrate to be processed, with high accuracy, by use of means which discharges drops. In drop discharge systems, there is a so-called sequential system in which solution is discharged continuously and a continuous line shaped pattern is formed, and a so-called on-demand system in which solution is discharged in a dot shaped manner. In the apparatus configuration in this invention, the on-demand system was shown, but it is possible to use solution discharge means according to the sequential system (not shown in the figure).

EMBODIMENTS

Embodiment 1

An embodiment 1 will be explained in detail by use of FIGS. 8(A)~(D). In this regard, however, this invention is not limited to the following explanation, and it is easily understood to persons with skill in the art to be able to change variously, without departing from a theme of this invention and a scope thereof, details thereof. Therefore, this invention is not a thing which is interrupted to be limited to a description content of embodiments which are shown below. Here, a manufacturing process for forming a drive TFT and a switch TFT and a capacitance on an identical substrate by use of this invention will be explained.

As a substrate 800, it is possible to use the substrates which were described in the embodiment mode 1. In this embodiment, a glass substrate (Corning Corporation make, #7059) is used. Subsequently, on the substrate 800, a base film 801, which is composed of an insulating film, is formed. The base film 801 may be any one of a single layer or a laminated configuration, and in this embodiment, a 2 layer configuration is used, and by use of a sputtering method, as a first layer, silicon nitride oxide film with 50 nm, and as a second layer, a silicon oxide nitride film with a thickness of 50 nm, are formed, and after that, by a method such as a CMP method, a surface is planarized.

Then, on the base film 801, a semiconductor layer is formed. As to the semiconductor layer, firstly, by a publicly known method (sputtering method, LPCVD method, plasma CVD method etc.), an amorphous silicon film is formed with a thickness of 25 to 80 nm, and then, the semiconductor film is crystallized by use of a publicly known crystallization method (laser crystallization method, RTA or thermal crystallization method using a furnace anneal oven).

In addition, it is also possible to crystallize the amorphous silicon film by use of a thermal crystallization method which uses a metal element for facilitating crystallization. A solution containing Ni is held on the amorphous silicon film, and dehydrogenation (500° C., 1 hour) is applied to this amorphous silicon film, and thereafter, thermal crystallization (550° C., 4 hours) is carried out, to form a crystalline silicon film. In passing, as a laser in case of fabricating a crystalline semiconductor film in the laser crystallization method, a gas laser or a solid-state laser of continuous oscillation or pulse oscillation may be used. As the gas laser of the former, an eximer laser, a YAG laser etc. are cited, and as the solid-state laser of the latter, cited are a laser etc. which used a crystal of YAG, $YVO_4$, or the like in which Cr, Nd etc. was doped. In passing, on the occasion of crystallization of the amorphous silicon film, in order to obtain a crystal with a large particle diameter, it is preferable to use a solid-state laser which is capable of continuous oscillation, and to apply second to fourth higher harmonic waves of a fundamental wave. In case of using the above-described laser, it is fine if a laser beam, which was radiated from the laser oscillator, is focused by an optical system in a line shaped manner, and irradiated to a semiconductor film.

In case that crystallization of the amorphous silicon film was carried out by use of a metal element for facilitating crystallization, the above-described metal element remains in the crystalline silicon film. On that account, an amorphous silicon film of 50 to 100 nm is formed on the crystalline silicon film, and by carrying out heat treatment (RTA method, thermal anneal by use of a furnace anneal oven, etc.), the above-described metal element is dispersed in the amorphous silicon film, and the amorphous silicon film is removed by carrying out etching after heat treatment. As a result of that, it is possible to reduce or remove a content of a metal element in the crystalline silicon film.

In order to control a threshold value of TFT, doping (channel doping) of a minute amount of an impurity element (boron) is carried out.

Then, the obtained crystalline silicon film is patterned in a desired shape, to form island shaped semiconductor layers 802 to 804. It is possible to form the semiconductor layers 802 to 804 by a drop discharge method according to this invention. That is, as a solution, a resist is used, and over carrying out solidification of a land resist by irradiating a laser beam, formation of a resist pattern is carried out. Subsequently, the resist pattern is used as a mask, and by a dry etching method, the semiconductor layers 802 to 804 are formed. In passing, as a semiconductor film for forming the semiconductor layers, a compound semiconductor film having an amorphous configuration, such as an amorphous semiconductor film, a micro crystal semiconductor film, a crystalline semiconductor film or an amorphous silicon germanium, may also be used.

Then, a gate insulating film 805 for covering the semiconductor layers 802 to 804 is formed. The gate insulating film 805 is formed by use of a plasma CVD method and a sputter method, as an insulating film which contains silicon with a thickness of 40 to 150 nm. In this embodiment, as the gate insulating film 805, a silicon oxide nitride film with a thickness of 115 nm is formed by a plasma CVD method.

Then, by laser beam irradiation and a drop discharge method, first electrically conductive layers (gate wiring, gate electrode, capacitor electrode) 806 to 809 are formed under reduced pressure or in vacuum. In this embodiment, such liquid that nano-fine particles of Al were dispersed in an organic solvent by use of a surface active agent, is discharged to form a gate pattern. In particular, since pattern accuracy of a gate electrode has a decisive influence on a transistor characteristic on a large scale, it is useful to simultaneously use laser beam irradiation for improving a performance of an active matrix type display. It is also useful to use the laser beam irradiation, for example, only for a gate electrode portion on a Si pattern, which is particularly important, without using it for every pattern.

In addition, as a composition which is discharged from a nozzle, a ultra-fine article (nano-metal particle), in which silver (Ag), gold (Au), platinum (Pt) were dispersed with a particle diameter of 10 nm or less, may be used. In this manner, when a composition, in which particles with fine particle diameters were dispersed or dissolved in a solvent, was used, it is possible to solve a problem of clogging of a nozzle. In passing, in this invention in which the drop discharge system is used, it becomes necessary for a particle diameter of a constituent material of the compound to be smaller than a particle diameter of the nozzle. In addition, an electrically conductive polymer (electrically conductive polymer) such as polyethylene dioxythiophene/polystyrene sulfonic acid (PEDT/PSS) water solution may be used.

In addition, when a low resistance metal such as silver and copper is used as a wiring material, wiring resistance is realized as low resistance, and therefore, it is preferable in case of using a large size substrate. Furthermore, since it is difficult to process these metal materials by a normal dry etching method, it is extremely effective to carry out direct patterning by the drop discharge method. In this regard, however, for example, in case of copper etc., in order not to have a bad effect on a electric characteristic of a transistor, it is preferable to dispose an electrically conductive film of a barrier property for preventing diffusion. By the electrically conductive film of a barrier property, there occurs no case that copper is diffused in a semiconductor that a transistor has, and it is possible to form a wiring. As this electrically conductive film of a barrier property, it is possible to use a laminated layer of 1 kind or plural kinds selected from tantalum nitride (TaN), titanium nitride (TiN) or tungsten nitride (WN). In addition, it is very useful to use a silicon nitride film which has large concentration and which is very dense. In addition, since copper is easily oxidized, it is preferable to simultaneously use antioxidant etc.

After that, by applying heat treatment to the substrate on which the first electrically conductive layer was formed, at normal pressures or reduced pressures, or in vacuum, within a range of 150 to 300° C., that solvent is evaporated, and its composition density is improved, and a resistance value is lowered. In this regard, however, for a solvent of a composition which is discharged from drop discharge means, a thing, which vaporizes after it is dropped on a substrate, is suitable. In case that discharge is carried out in vacuum like this embodiment, as compared to a case under normal barometric pressure, it is characterized in that an evaporation rate is fast, and in particular, when a solvent such as toluene, which is highly volatile, it vaporizes instantaneously after the compound is dropped on the substrate. In the suchlike case, there is no problem to remove a process of heat treatment. However, even in case that a solvent of a composition is not limited in particular and a solvent, which vaporizes after it is dropped, was used, it may be designed to obtain a desired resistance value, by improving its composition density, by applying heat treatment. In addition, this heat treatment may be carried out every time a pattern was formed by the drop discharge method, or may be carried out with respect to each arbitrary process, or may be carried out collectively after all processes were finished.

For the heat treatment, a lamp anneal apparatus which heats at high speed directly a substrate by use of a lamp such as a halogen lamp as a heating source, and a laser irradiation apparatus which irradiates a laser beam, are used. The both sides can apply heat treatment only to a desired place, by scanning a heating source. As another method, furnace anneal with predetermined temperature being set may be used. In this regard, however, in case of using a lamp, preferable is light which does not destroy a composition of a thin film to which heat treatment is carried out, and which enables only heating, and for example, light of longer wavelength than 40 nm, i.e., light of wavelength more than infrared light. From an aspect of handling, it is preferable to use far-infrared ray (representative wavelength is 4 to 25 μm). In addition, in case of using a laser beam, it is preferable to form a shape of a beam spot on a substrate in a line shape, so as to become the same length as a length of a column or a row in tune with a line of drops which land. Doing so, it is possible to finish laser irradiation by single scanning. (FIG. 8(A))

Figure 8:
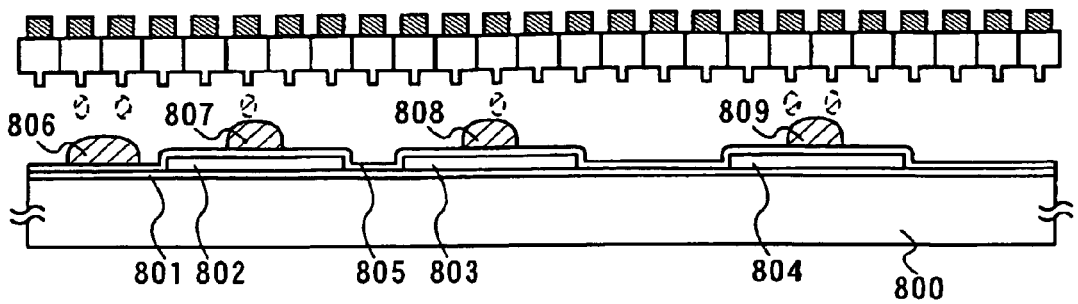
FIG. 8(A) to FIG. 8(D) are views which show one example of a method for manufacturing a semiconductor device, of this invention.
Figure 8:
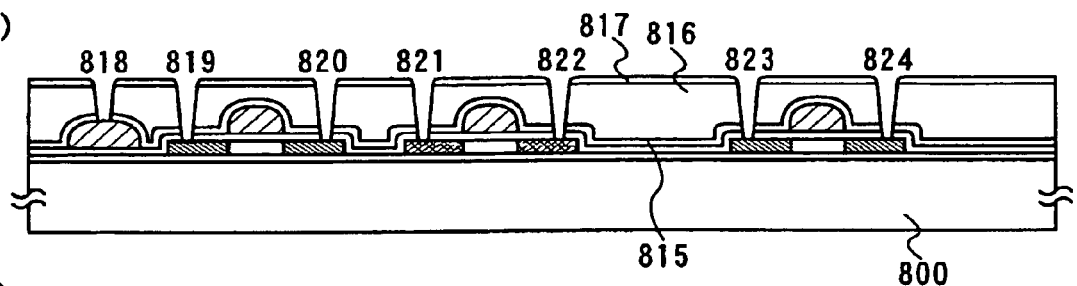
Figure 8:
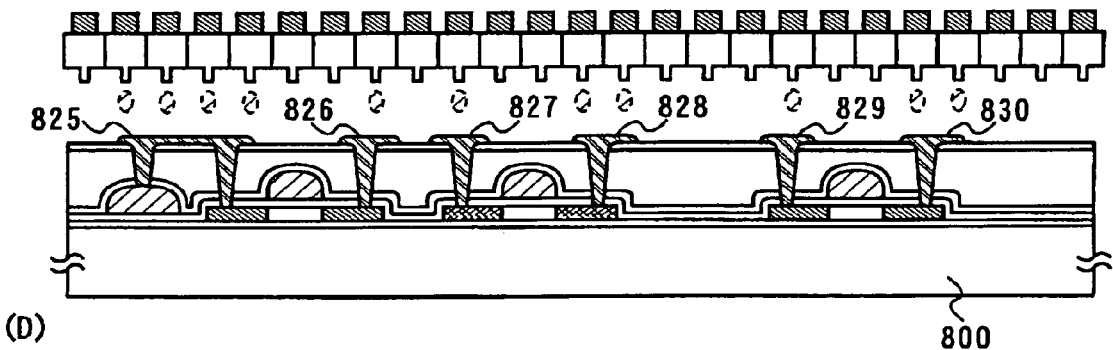
Figure 8:
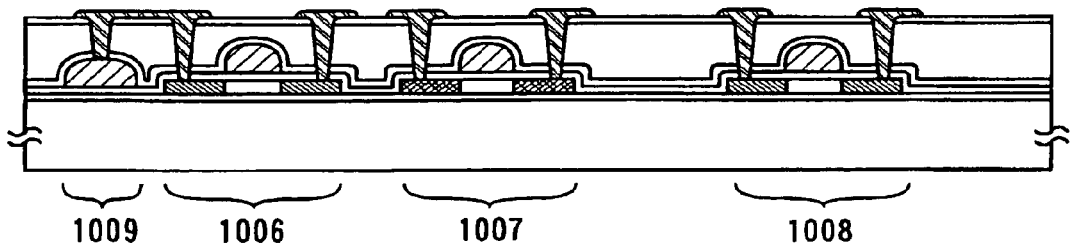

Next, as shown in FIG. 8(B), using gate electrodes 807 to 809 as masks, doping processing for adding an impurity element which gives N type or P type is carried out to the semiconductor layers 802 to 804. In this embodiment, an impurity element, which gives N type, is added to the semiconductor layers 802 and 804, and an impurity element, which gives P type, is added to the semiconductor layer 803, and impurity regions are formed.

After this, a first interlayer insulating film 815, which covers an entire surface, is formed once. The first interlayer insulating film 815 is formed by an insulating film which contains silicon with a film thickness of 40 to 150 nm, by use of a plasma CVD method and a sputter method. Further, in the same manner, a second interlayer insulating film 816, which covers an entire surface, is formed. As the second interlayer insulating film 816, a silicon oxide film which was formed by a CVD method, a silicon oxide film which was applied by a SOG (Spin On Glass) method, an organic insulating film such as acrylic or non-photosensitive organic insulating film is formed with a thickness of 0.7 to 5 μm. In passing, since the second interlayer insulating film 816 has the strong meaning to alleviate and planarize concavity and convexity due to TFT which was formed on the substrate 800, a film, which excels in planarity, is preferable. Further, a silicon nitride film, which becomes a third interlayer insulating film 817, is formed with a thickness of 0.1 μm.

Thereafter, a resist pattern for forming contact holes 818 to 824 is formed by simultaneous use of laser irradiation and drop discharge, in the same manner as in the above-described case. Then, using the resist pattern as a mask, the contact holes 818 to 824 are formed by an anisotropic dry etching method. It is also possible to form these contact holes 818 to 824 by laser irradiation of this invention. In this case, a resist mask is not required at all. In addition, as a solution to make discharge, if an acid series drop such as HF series is used, formation of a contact hole by use of discharge means of a drop is also possible.

Next, as shown in FIG. 8(C), by simultaneous use of laser beam irradiation and drop discharge, second electrically conductive layers (source wiring, drain wiring) 825 to 830 are formed so as to be extended up to bottom parts of the contact holes 818 to 824. In this embodiment, as a composition to be discharged, used is a solution in which nano-fine particles of silver are dispersed in an organic solvent by use of a surface active agent.

Next, as shown in FIG. 8(D), heat treatment is carried out. By the processes up to here, it is possible to form a transistor on the substrate 800 which has an insulating surface.

Subsequently, a pixel electrode, which is composed of a transparent electric conductor, is formed (not shown in the figure), so as to be electrically connected to the second electrically conductive layer 825, on an entire surface. As the pixel electrode, by way of example, cited are a chemical compound of indium oxide and tin oxide (ITO), a chemical compound of indium oxide and zinc oxide, zinc oxide, tin oxide, indium oxide, titanium nitride, and so on.

As above, it is possible to manufacture an active matrix substrate which is configured by a pixel electrode which is formed by a source wiring (not shown in the figure), a switching TFT 1006 and a capacitance element 1009 of a pixel part, a drive circuit which is formed by drive TFTs 1007, 1008, and a terminal part (not shown in the figure). And, if need arises, the active matrix substrate or an opposite substrate is segmented in a desired shape. After this, it is glued together with an opposite substrate on which a common electrode, a color filter, black matrix etc. were formed. And, liquid crystals are injected by a predetermined method, to complete a liquid crystal display device. On a liquid crystal module which was obtained by the above-described processes, a back light, an optical waveguide are disposed, and they are covered with a cover, and then, an active matrix type liquid crystal display device (transmission type) is completed. In passing, the cover and the liquid crystal module are fixed by use of an adhesive agent and organic resin. In addition, since it is of a transmission type, polarization plates are glued with both of the active matrix substrate and the opposite substrate.

In addition, this embodiment showed an example of a transmission type, but it is not restrictive in particular, and it is also possible to manufacture liquid crystal display apparatuses of a reflection type and a semi-transmission type. In case of obtaining a reflection type liquid crystal display device, as the pixel electrode, a metal film with high light reflectance ratio, representatively, a material film having aluminum or silver as a principal component, or a laminated film of them, etc. may be used.

As above, the active matrix type liquid crystal display device was explained, and it is possible to apply to a case of an active matrix type EL (Electro Luminescence) display device, in the same manner. In addition, with regard to the materials, forming methods, which were taken up in this invention example, it is possible to properly select and use in line with the theme of this invention.

Embodiment 2

Figure 9:
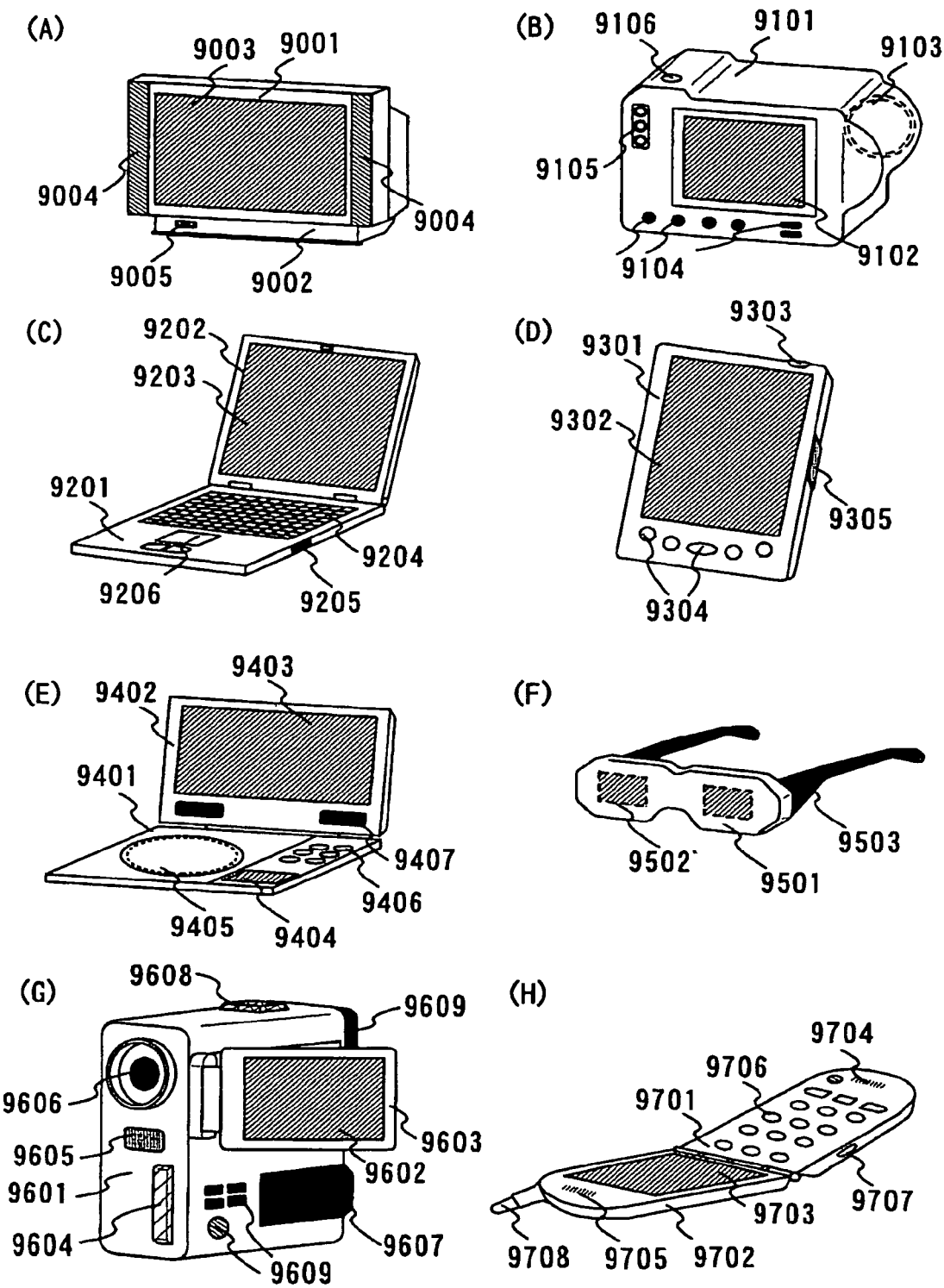
FIG. 9(A) to FIG. 9(H) are views which show one example of an electronic equipment which used this invention.

Next, as an electronic equipment which used this invention, cited are a video camera, a digital camera, a goggle type display (head mount display), a navigation system, a sound reproducing apparatus (car audio, audio compo etc.), a notebook type personal computer, a game equipment, a portable information terminal (mobile computer, portable telephone, portable type game machine or electronic book etc.), an image reproducing apparatus which was equipped with a recording medium (concretely speaking, an apparatus which reproduces a recording medium such as Digital Versatile Disc (DVD), and which was equipped with a display which can display its images) and so on. Concrete examples of those electronic equipments are shown in FIG. 9.

FIG. 9(A) is a display apparatus, and includes a housing 9001, a support table 9002, a display part 9003, a speaker part 9004, a video input terminal 9005 and so on. This invention can be used for an electric circuit which configures the display part 9003. In addition, by this invention, the display apparatus, which is shown in FIG. 9(A), is completed. In passing, the display apparatus includes all display apparatuses for use in information display, such as for use in a personal computer, for use in television broadcasting reception of 20 to 80 inches, and for use in advertisement display.

FIG. 9(B) is a digital still camera, and includes a main body 9101, a display part 9102, an image receiving part 9103, an operation key 9104, an external connection port 9105, a shutter 9106 and so on. This invention can be used for an electric circuit which configures the display part 9102. In addition, by this invention, the digital still camera, which is shown in FIG. 9(B), is completed.

FIG. 9(C) is a notebook type personal computer, and includes a main body 9201, a housing 9202, a display part 9203, a keyboard 9204, an external connection port 9205, a pointing mouse 9206 and so on. This invention can be used for an electric circuit which configures the display part 9203. In addition, by this invention, the notebook type personal computer, which is shown in FIG. 9(C), is completed.

FIG. 9(D) is a mobile computer, and includes a main body 9301, a display part 9302, a switch 9303, an operation key 9304, an infrared port 9305 and so on. This invention can be used for an electric circuit which configures the display part 9302. In addition, by this invention, the mobile computer, which is shown in FIG. 9(D), is completed.

FIG. 9(E) is a portable type image reproducing apparatus which was equipped with a recording medium (concretely speaking, DVD reproducing apparatus), and includes a main body 9401, a housing 9402, a display part A 9403, a display part B 9404, a recording medium (DVD etc.) reading part 9405, an operation key 9406, a speaker part 9407 and so on. The display part A 9403 displays mainly image information, and the display part B 9404 displays mainly textual information, and this invention can be used for electric circuits which configure the display part A 9403, the display part B 9404. In passing, the image reproducing apparatus which was equipped with a recording medium includes a home-use game equipment and so on. In addition, by this invention, the DVD reproducing apparatus, which is shown in FIG. 9(E), is completed.

FIG. 9(F) is a goggle type display (heat mount display), and includes a main body 9501, a display part 9502, an arm part 9503 and so on. This invention can be used for an electric circuit which configures the display part 9502. In addition, by this invention, the goggle type display, which is shown in FIG. 9(F), is completed.

FIG. 9(G) is a video camera, and includes a main body 9601, a display part 9602, a housing 9603, an external connection port 9604, a remote control receiving part 9605, an image receiving part 9606, a battery 9607, an audio input part 9608, an operation key 9609, an eyepiece part 9610 and son on. This invention can be used for an electric circuit which configures the display part 9602. In addition, by this invention, the video camera, which is shown in FIG. 9(G), is completed.

FIG. 9(H) is a portable telephone and includes a main body 9701, a housing 9702, a display part 9703, an audio input part 9704, an audio output part 9705, an operation key 9706, an external connection port 9707, an antenna 9708 and so on. This invention can be used for an electric circuit which configures the display part 9703. In passing, it is possible to suppress power consumption current of the portable telephone by displaying white color characters on a black color background. In addition, by this invention, the portable telephone, which is shown in FIG. 9(H), is completed.

As above, an applicable scope of this invention is extremely wide, and it is possible to use for electronic equipments in every field. In addition, the electronic equipments, which were shown here, may use the semiconductor device of either configuration which was shown in this invention.

Embodiment 3

Figure 10:
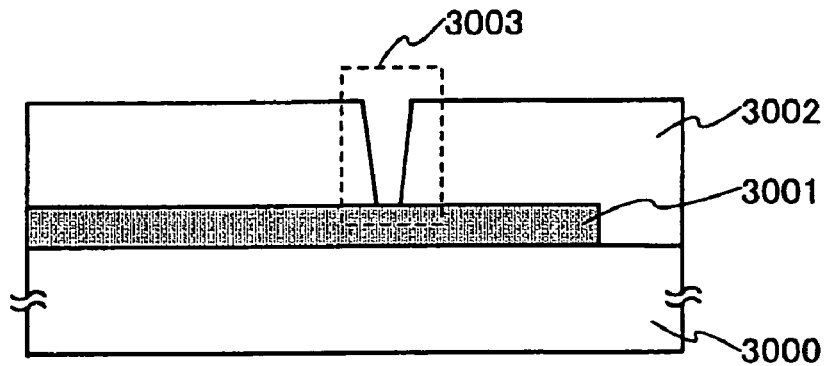
FIG. 10(A) to FIG. 10(C) are views which show one example of a method for filling a contact hole with drops.
Figure 10:
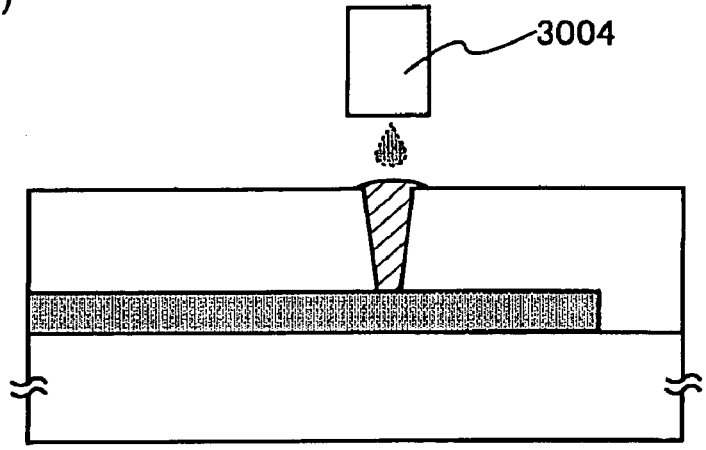
Figure 10:
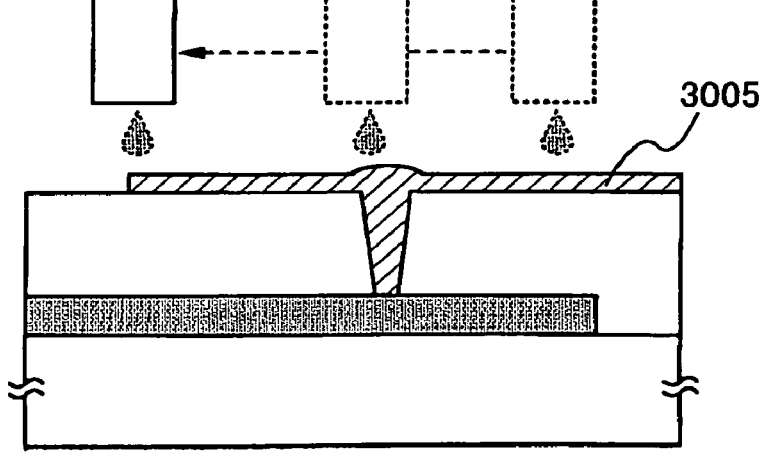

This embodiment explains a method for filling a contact hole (opening part) with a drop composition, by use of a drop discharge method, by use of FIG. 10.

In FIG. 10(A), after a semiconductor 3001 was formed on a substrate 3000 and an insulator 3002 was formed on the semiconductor 3001, a contact hole 3003 is formed in the insulator 3002. Here, as a method for forming the contact hole, a drop discharge method is used. That is, by discharging a wet etching solution from a nozzle, an insulating film at an arbitrary region is etched, to form the contact hole 3003.

Next, as shown in FIG. 10(B), a nozzle 3004 is moved above the contact hole 3003, and drops are continuously discharged to the contact hole 3003, and the contact hole 3003 is filled with the drops.

Next, as shown in FIG. 10(C), after a position of the nozzle 3004 was reset, the nozzle is moved in the order of a position A, a position B, a position C, and drops are discharged selectively, and thereby, it is possible to fill the contact hole 3003 with the drops. By fitting an irradiation process of a laser beam as shown in the embodiment mode 1, and a drop discharge apparatus as shown in the embodiment mode 2, in this embodiment, it is possible to form an electric conductor 3005 which was filled in the contact hole with a composition of the drop. In this method, the nozzle 3004 scans the same place a plurality of times. By the above-described processes, it is possible to continuously carry out formation of the contact hole and formation of a wiring, by use of the drop discharge method.

In passing, it is possible to fit this embodiment in the embodiment 1 and the embodiment 2.

Embodiment 4

In this embodiment, a method for filling a contact hole (opening part) with a drop composition, by a scanning method which is different from the above-described one will be described by use of FIGS. 11(A)~11(C).

Figure 11:
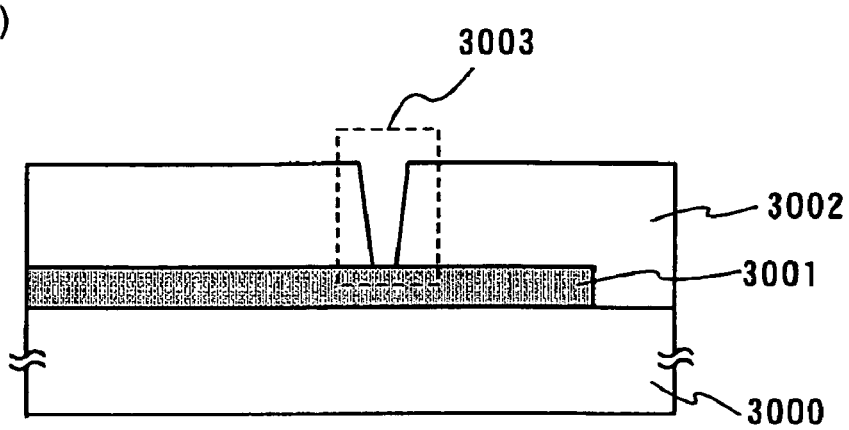
FIG. 11(A) to FIG. 11(C) are views which shows one example of a method for filling a contact hole with drops.
Figure 11:
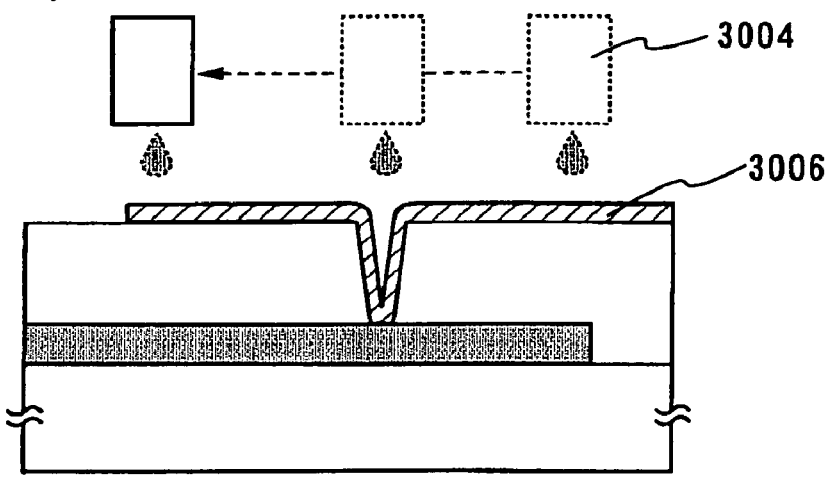
Figure 11:
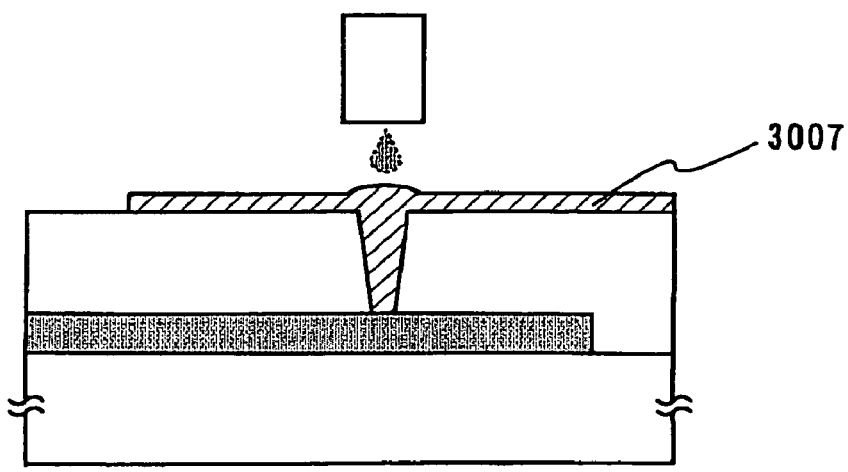

In the same manner as in the embodiment 3, a contact hole as shown in FIG. 11(A) is formed. In passing, FIG. 11(A) corresponds to FIG. 10(A).

Next, as shown in FIG. 11(B), the nozzle 3004 is moved in the order of the position A, the position B, the position C, and drops are selectively discharged only to a region which forms a wiring, to form the conductor 3006.

Next, as shown in FIG. 11(C), the nozzle 3004 is moved above the contact hole 3003, and drops are continuously discharged to the contact hole 3003.

As a result of that, it is possible to fill the contact hole 3003 with the drops.

By fitting an irradiation process of a laser beam as shown in the implementation mode 1, and a drop discharge apparatus as shown in the implementation mode 2, in this embodiment, it is possible to form an electric conductor 3007 which was filled in the contact hole with a composition of the drop. In this method, the nozzle 3004 scans the same place a plurality of times. By the above-described processes, it is possible to continuously carry out formation of the contact hole and formation of a wiring, by use of the drop discharge method.

In passing, it is possible to fit this embodiment in the embodiment 1 and the embodiment 2.

Embodiment 5

Next, a method for filling a contact hole (opening part) with a drop composition by a scanning method which is different from the above-described one will be described by use of FIGS. 12(A)~12(C).

Figure 12:
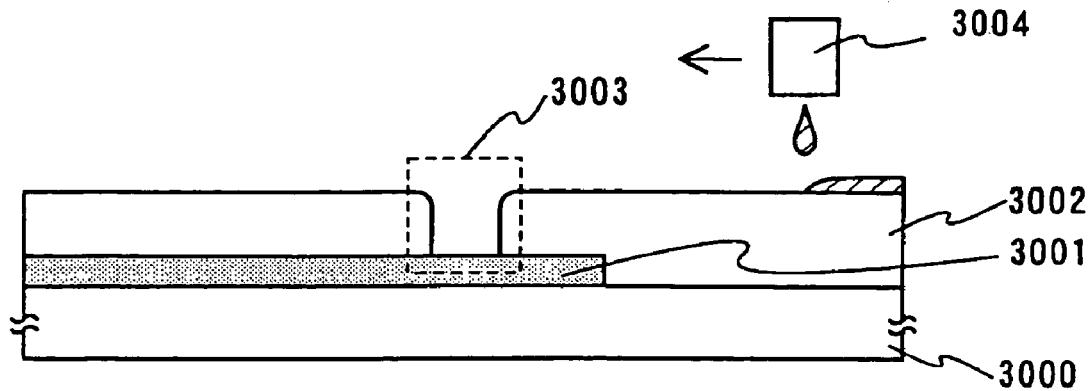
FIG. 12(A) to FIG. 12(C) are views which shows one example of a method for filling a contact hole with drops.
Figure 12:
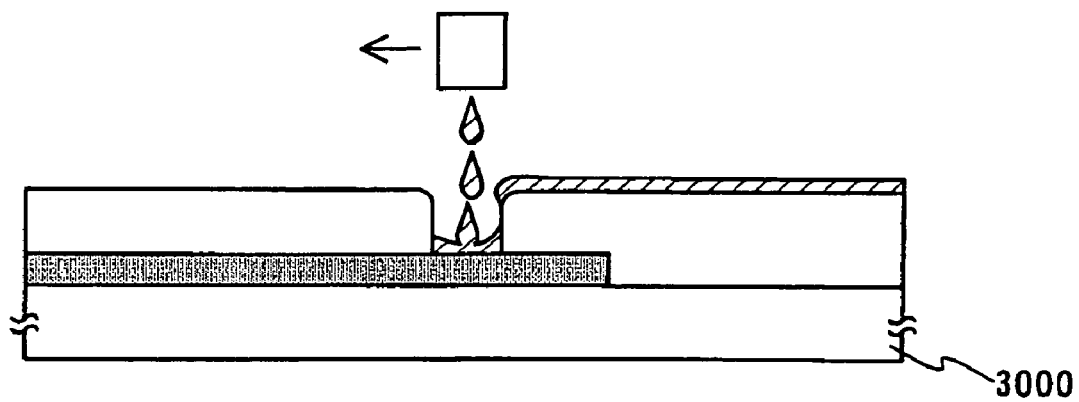
Figure 12:
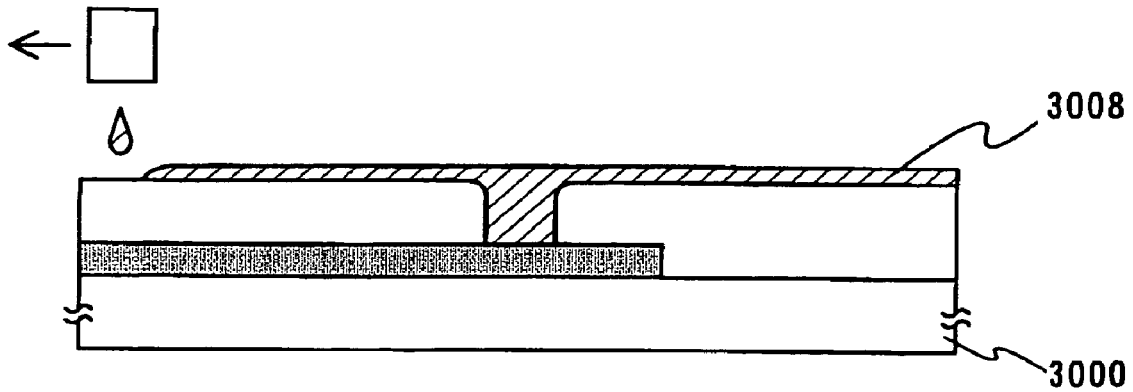

In the same manner as in the embodiment 3, a contact hole as shown in FIG. 12(A) is formed. In passing, a substrate, an insulating film, and a contact hole of FIG. 12(A) correspond to FIG. 10(A).

In this embodiment, by moving the nozzle 3004 to an arrow direction, drops are discharged selectively.

Next, as shown in FIG. 12(B), when the nozzle 3004 reached to a upper side of the contact hole 3003, drops are continuously discharged, to fill the contact hole with a drop composition.

As a result of that, as shown in FIG. 12(C), it is possible to fill the contact hole 3003 with the drop composition. By fitting an irradiation process of a laser beam as shown in the embodiment mode 1, and a drop discharge apparatus as shown in the embodiment mode 2, in this embodiment, it is possible to form an electric conductor 3008 which was filled in the contact hole with a composition of the drop. In this method, the nozzle 3004 does not scan the same place a plurality of times, but scans in one direction. By the above-described processes, it is possible to continuously carry out formation of the contact hole and formation of a wiring, by use of the drop discharge method.

In passing, it is possible to fit this embodiment in the embodiment 1 and the embodiment 2.

Embodiment 6

Figure 13:
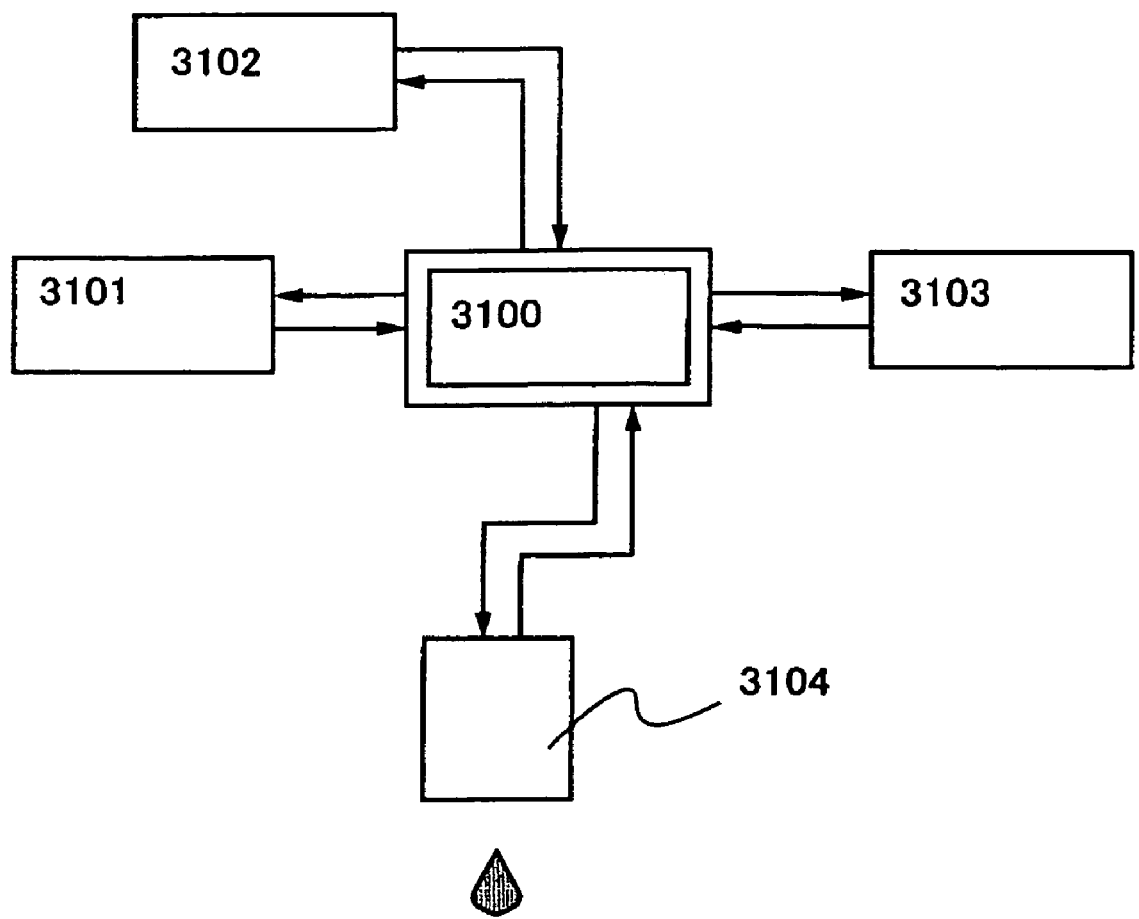
FIG. 13 is a view which shows one example of a configuration of drop discharge apparatus control means.

A system for manufacturing a circuit wiring which was inputted in a personal computer etc. by use of a drop discharge method will be briefly explained by use of FIG. 13.

As constituent elements which become a backbone, cited are CPU 3100, a volatile memory 3101, a non-volatile memory 3102 and input means 3103 such as a keyboard and an operation button, a drop discharge apparatus which has drop discharge means 3104. Speaking briefly about its operation, when data of a circuit wiring is inputted by the input means 3013, this data is stored in the volatile memory 3101 or the non-volatile memory 3102 through CPU 3100. And, on the basis of this data, the drop discharge means 3104 discharges drops selectively, and thereby, it is possible to form a wiring.

In passing, it is possible to fit this embodiment in the embodiment 1 to the embodiment 5.

By the above-described configuration, a mask, which was designed for light exposure, becomes unnecessary, and it is possible to significantly reduce processes of light exposure, development and so on. As a result of that, throughput is elevated and it is possible to significantly improve productivity. In addition, this configuration may also be used for the purpose of repairing a breaking spot of a wiring, a bad spot of an electric connection between a wiring and an electrode. In this case, it is preferable that, for example, a repair spot is inputted into a personal computer etc., and drops are discharged to the spot from the nozzle. In addition, it is possible to easily form a wiring even to a large size substrate with such a size that at least one side exceeds 1 m, and further, it is fine if only a material with a necessary amount is applied to a desired spot, and therefore, a useless material becomes as little as possible, and then, improvement of utilization efficiency of a material, reduction of a manufacturing cost are realized.

Embodiment 7

In this embodiment, a method for manufacturing an inverse stagger type TFT, but not the forward stagger type TFT which was shown in the embodiment 1, and an active matrix type EL display apparatus using the same, will be explained.

As a substrate 2000, it is possible to use the substrate which was described in the embodiment mode 1. In this embodiment, a glass substrate (Corning Corporation make, #7059) is used.

Subsequently, on the substrate 2000, by laser beam irradiation and a drop discharge method, first electrically conductive layers (gate wiring, gate electrode, capacitor electrode) 2001, 2002 are formed under reduced pressure or in vacuum (FIG. 14(A)). In this embodiment, such liquid that nano-fine particles of Al were dispersed in an organic solvent by use of a surface active agent, is discharged to form a gate pattern. In particular, since pattern accuracy of a gate electrode has a decisive influence on a transistor characteristic on a large scale, it is useful to simultaneously use laser beam irradiation for improving a performance of an active matrix type display. It is also useful to use the laser beam irradiation, for example, only for a gate electrode portion which is particularly important, without using it for every pattern.

In addition, as a composition which is discharged from a nozzle, a ultra-fine particle (nano-metal particle), in which silver (Ag), gold (Au), platinum (Pt) were dispersed with a particle diameter of 10 nm or less, may be used. In this manner, when a composition, in which particles with fine particle diameters were dispersed or dissolved in a solvent, was used, it is possible to solve a problem of clogging of a nozzle. In passing, in this invention in which the drop discharge system is used, it becomes necessary for a particle diameter of a constituent material of the composition to be smaller than a particle diameter of the nozzle. In addition, an electrically conductive polymer (electrically conductive polymer) such as polyethylene dioxythiophene/polystyrene sulfonic acid (PEDT/PSS) water solution may be used.

In addition, when a low resistance metal such as silver and copper is used as a wiring material, wiring resistance is realized as low resistance, and therefore, it is preferable in case of using a large size substrate. Furthermore, since it is difficult to process these metal materials by a normal dry etching method, it is extremely effective to carry out direct patterning by the drop discharge method. In this regard, however, for example, in case of copper etc., in order not to have a bad effect on a electric characteristic of a transistor, it is preferable to dispose an electrically conductive film of a barrier property for preventing diffusion. By the electrically conductive film of a barrier property, there occurs no case that copper is diffused in a semiconductor that a transistor has, and it is possible to form a wiring. As this electrically conductive film of a barrier property, it is possible to use a laminated layer of 1 kind or plural kinds selected from tantalum nitride (TaN), titanium nitride (TiN) or tungsten nitride (WN). In addition, it is very useful to use a silicon nitride film which has large concentration and which is very dense. In addition, since copper is easily oxidized, it is preferable to simultaneously use antioxidant etc.

After that, by applying heat treatment to the substrate on which the first electrically conductive layer was formed, at normal pressures or reduced pressures, or in vacuum, within a range of 150 to 300° C., that solvent is evaporated, and its composition density is improved, and a resistance value is lowered. In this regard, however, for a solvent of a composition which is discharged from drop discharge means, a thing, which vaporizes after it is dropped on a substrate, is suitable. In case that discharge is carried out in vacuum like this embodiment, as compared to a case under normal barometric pressure, it is characterized in that an evaporation rate is fast, and in particular, when a solvent such as toluene, which is highly volatile, is used, it vaporizes instantaneously after the composition is dropped on the substrate. In the suchlike case, there is no problem to remove a process of heat treatment. However, even in case that a solvent of a composition is not limited in particular and a solvent, which vaporizes after it is dropped, was used, it may be designed to obtain a desired resistance value, by improving its composition density, by applying heat treatment. In addition, this heat treatment may be carried out every time a pattern was formed by the drop discharge method, or may be carried out with respect to each arbitrary process, or may be carried out collectively after all processes were finished.

For the heat treatment, a lamp anneal apparatus which heats at high speed directly a substrate by use of a lamp such as a halogen lamp as a heating source, and a laser irradiation apparatus which irradiates a laser beam, are used. The both sides can apply heat treatment only to a desired place, by scanning a heating source. As another method, furnace anneal with predetermined temperature being set may be used. In this regard, however, in case of using a lamp, preferable is light which does not destroy a composition of a thin film to which heat treatment is carried out, and which enables only heating, and for example, light of longer wavelength than 400 nm, i.e., light of wavelength more than infrared light. From an aspect of handling, it is preferable to use far-infrared ray (representative wavelength is 4 to 25 μm). In addition, in case of using a laser beam, it is preferable to form a shape of a beam spot on a substrate in a line shape, so as to become the same length as a length of a column or a row in tune with a line of drops which land. Doing so, it is possible to finish laser irradiation by single scanning.

Figure 14:
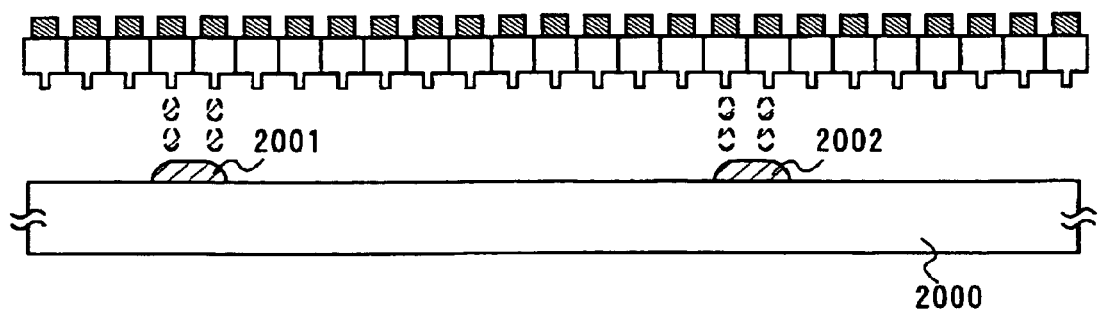
FIG. 14(A) to FIG. 14(C) are views which show one example of a method for manufacturing a semiconductor device of the invention.
Figure 14:
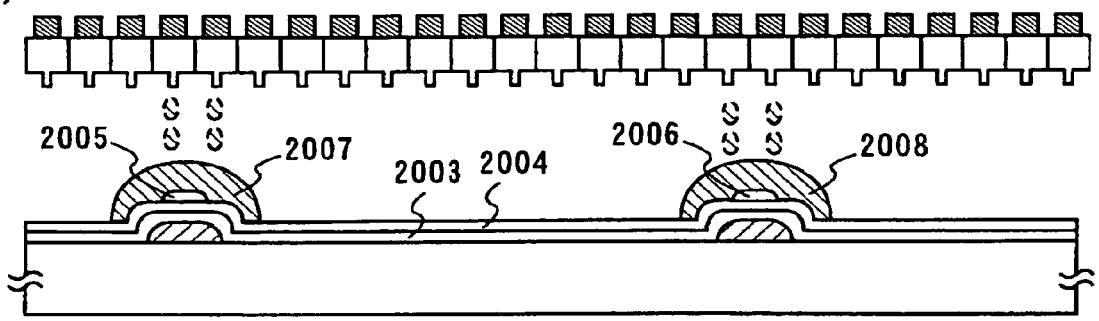
Figure 14:
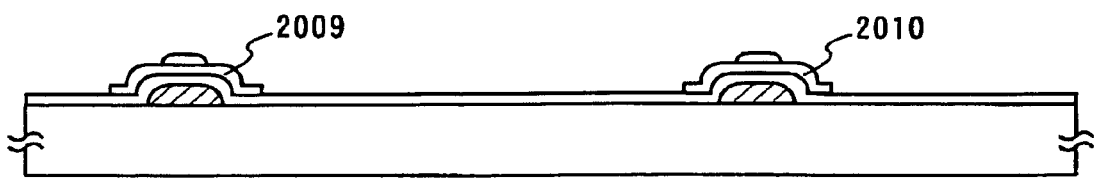

Next, as shown in FIG. 14(B), a gate insulating film 2003 is formed so as to cover the first electrically conductive layers 2001, 2002. As the gate insulating film 2003, it is possible to use an insulating film such as silicon oxide, silicon nitride and silicon nitride oxide. As the gate insulating film 2003, an insulating film of a single layer may be used, and a plurality of insulating films may be laminated. In this embodiment, an insulating film, in which silicon nitride, silicon oxide, silicon nitride were laminated in sequence, is used as the gate insulating film 2003. In addition, as a film forming method, it is possible to use a plasma CVD method, a sputtering method and so on. In order to form a dense insulating film which can suppress a gate leakage current at low film forming temperature, it is fine if a rare gas element such as argon is included in reaction gas, and mixed in an insulating film to be formed. In addition, it is possible to use aluminum nitride as the gate insulating film 2003. Aluminum nitride has relatively high thermal conductivity, and it is possible to effectively exhale heat which was generated in TFT.

Next, a first semiconductor film 2004 is formed. The first semiconductor film 2004 can be formed by amorphous (amorphous) semiconductor or semi-amorphous semiconductor (SAS). In addition, a polycrystalline semiconductor film may also be used. In this embodiment mode, as the first semiconductor film 2004, semi-amorphous semiconductor is used. The semi-amorphous semiconductor is of higher crystallinity than amorphous semiconductor and can obtain high mobility, and in addition, it is possible to form without increasing processes for crystallizing, unlike polycrystalline semiconductor.

It is possible to obtain the amorphous semiconductor by glow-discharge-decomposing silicide gas. As representative silicide gas, $SiH_4$, $Si_2H_6$ are cited. This silicide gas may be used by being diluted with hydrogen, hydrogen and helium.

In addition, it is also possible to obtain SAS by glow-discharge-decomposing the silicide gas. As representative silicide gas, it is $SiH_4$, and other than that, it is possible to use $Si_2H_6$, $SiH_2Cl_2$, $SiHCl_3$, $SiCl_4$, $SiF_4$ and so on. In addition, by using by diluting this silicide gas by hydrogen or gas in which one kind or plural kinds of rare gas elements, which were selected from helium, argon, krypton and neon, were added to hydrogen, it is possible to make formation of SAS an easy thing. It is preferable that silicide gas is diluted with in a range of a dilution ratio being 2 fold to 1000 fold. In addition, further, it is fine if carbide gas such as $CH_4$, $C_2H_6$, germanic gas such as $GeH_4$ and $GeF_4$, $F_2$ and so on are mixed in the silicide gas and an energy band width is asjusted to 1.5 to 2.4 eV or 0.9 to 1.1 eV. TFT, which used SAS as the first semiconductor film, can obtain mobility of 1 to $10cm^2/Vsec$, and more than that.

In addition, the first semiconductor film may be formed by laminating a plurality of SASs which were formed by different gases. For example, by laminating SAS which was formed by use of gas which includes fluorine atoms, and SAS which was formed by use of gas which includes hydrogen atoms, among the above-described various gases, it is possible to form the first semiconductor film.

It is possible to carry out reaction and production of a coating layer by glow discharge decomposition, under reduced pressure or barometric pressure. In case of carrying out under reduced pressure, it may be carried out within a range of pressure being roughly 0.1 Pa to 133 Pa. Electric power for forming glow discharge is 1 MHz to 120 MHz, and preferably, high frequency electric power of 13 MHz to 60 MHz may be supplied. Pressure is roughly in a range of 0.1 Pa to 133 Pa, and power supply frequency is 1 MHz to 120 MHz, preferably 13 MHz to 60 MHz. Substrate heating temperature may be 300° C. or less, and preferably set to 100 to 250° C. As an impurity element in a film, it is desirable that an impurity of an atmospheric constituent such as oxygen, nitrogen, carbon is set to $1\times10^{20}$ atoms/$cm^3$ or less, and in particular, oxygen concentration is set to $5\times10^{19}$ atoms/$cm^3$ or less, preferably $1\times10^{19}$ atoms/$cm^3$ or less.

In passing, in case of forming the semiconductor film by use of $Si_2H_6$, $GeF_4$ or $F_2$, crystals are grown from a side of the semiconductor film, which is closer to a substrate, and therefore, crystallinity of the semiconductor film is higher at a closer side to the substrate. Thus, in case of a bottom gate type TFT in which a gate electrode is closer to the substrate than the first semiconductor film, it is possible to use a high crystallinity region, at the side closer to the substrate, in the first semiconductor film, as a channel forming region, and therefore, it is possible to more heighten mobility, which is suitable.

In addition, in case of forming the semiconductor film by use of $SiH_4$ and $H_2$, it is possible to obtain a large crystal grain at a closer side to a surface of the semiconductor film. Thus, in case of a top gate type TFT in which the first semiconductor film is closer to the substrate than a gate electrode, it is possible to use a high crystallinity region, at the side away from the substrate, in the first semiconductor film, as a channel forming region, and therefore, it is possible to more heighten mobility, which is suitable.

In addition, SAS shows a weak n type conductivity type when an impurity aiming at valence electron control is not added intentionally. This is because glow discharge, which is of higher electric power than the time of forming amorphous semiconductor, is carried out and therefore, oxygen is easily mixed in the semiconductor film. In this connection, by adding an impurity which gives a p type, to the first semiconductor film in which a channel forming region of TFT is disposed, at the same time of this film formation, or after film formation, it becomes possible to carry out threshold value control. As the impurity which gives the p type, it is representatively boron, and it is fine if impurity gas such as $B_2H_6$, $BF_3$ is mixed in silicide gas with a ratio of 1 ppm to 1000 ppm. For example, in case of using boron as the impurity which gives the p type, it is fine if concentration of the boron is set to $1\times10^{14}$ to $6\times10^6$ atoms/$cm^3$.

Next, on the first semiconductor film 2004, protective films 2005, 2006 are formed, so as to be overlapped with a portion which becomes a channel forming region, in the first semiconductor film 2004. The protective films 2005, 2006 may be formed by use of a drop discharge method or a printing method, and may be formed by use of a CVD method, a sputtering method and so on. As the protective films 2005, 2006, it is possible to use an inorganic insulating film such as silicon oxide, silicon nitride, silicon nitride oxide, an insulating film such as siloxane series, and so on. In addition, these films are laminated, and it may be used as the protective films 2005, 2006. In this embodiment mode, silicon nitride which was formed by a plasma CVD method, and a siloxane series insulating film which was formed by a drop discharge method are laminated, and it is used as the protective films 2005, 2006. In this case, patterning of silicon nitride can be carried out by use of the silixane series insulating film which was formed by the drop discharge method as a mask.

Patterning of the first semiconductor film 2004 is carried out. The patterning of the first semiconductor film 2004 may be carried out by a lithography method, and may be carried out by use of a resist, which was formed by the drop discharge method, as a mask. In case of the latter, eliminated is a necessity to separately prepare a mask for light exposure, and thus, it is connected to reduction of a cost. In this embodiment mode, such an example that resists 2007, 2008, which were formed by the drop discharge method, are used, and patterning is carried out, will be shown. In passing, it is possible to use organic resin such as polyimide, acrylic, as the resists 2007, 2008. And, by dry etching which used the resists 2007, 2008, patterned first semiconductor films 2009, 2010 are formed FIG. 14(C).

Next, a second semiconductor film is formed, so as to cover the first semiconductor films 2009, 2010 after patterning. To the second semiconductor film, an impurity, which gives one conductivity type, has been added. In case of forming a n-channel type TFT, the impurity which gives n type, for example, phosphor may be added to the second semiconductor film. Concretely speaking, impurity gas such as $PH_3$ may be added to silicide gas, to form the second semiconductor film. It is possible to form the second semiconductor film having one conductivity type by semi-amorphous semiconductor, amorphous semiconductor, in the same manner as in the first semiconductor layers 2009, 2010.

In passing, in this embodiment, the second semiconductor film is formed so as to be in contact with the first semiconductor films 2009, 2010, but this invention is not limited to this configuration. A third semiconductor film, which functions as a LDD region, may be formed between the first semiconductor film and the second semiconductor film. In this case, the third semiconductor film is formed by semi-amorphous semiconductor or amorphous semiconductor. And, the third semiconductor film shows originally weak n-type conductivity type, even if an impurity for giving a conductivity type is not added intentionally. Thus, even if an impurity for giving a conductivity type is not added to the third semiconductor film, it can be used as a LDD region.

Next, wirings 2015 to 2018 are formed by use of a drop discharge method, and by using the wirings 2015 to 2018 as masks, the second semiconductor film is etched. Etching of the second semiconductor film can be carried out by dry etching under vacuum atmosphere or barometric pressure atmosphere. By the above-described etching, formed are second semiconductors 2011 to 2014, which function as source regions or drain regions, from the second semiconductor film. On the occasion of etching the second semiconductor film, it is possible to prevent over-etching of the first semiconductor films 2009, 2010, by the protective films 2005, 2006.

The wirings 2015 to 2018 can be formed in the same manner as the gate electrodes 2001, 2002. Concretely speaking, a conductive material, which has one or plural pieces of metals such as Ag, Au, Cu, Pd or metal compounds, is used. In case of using a drop discharge method, it is possible to form, by drying or baking at room temperature, after such a thing that the conductive material was dispersed in an organic series or inorganic series solvent was dropped from a nozzle. If it is possible to suppress aggregation by a dispersing agent, and to disperse in a solution, it is also possible to use a conductive material which has one or plural pieces of metals such as Cr, Mo, Ti, Ta, W, Al or metal compounds. Baking may be carried out under oxygen atmosphere, to lower resistance of the wirings 2015 to 2018. In addition, by carrying out film formation of a conductive material by the drop discharge method, a plurality of times, it is also possible to form the wirings 2015 to 2018 in which a plurality of conductive films were laminated.

Figure 15:
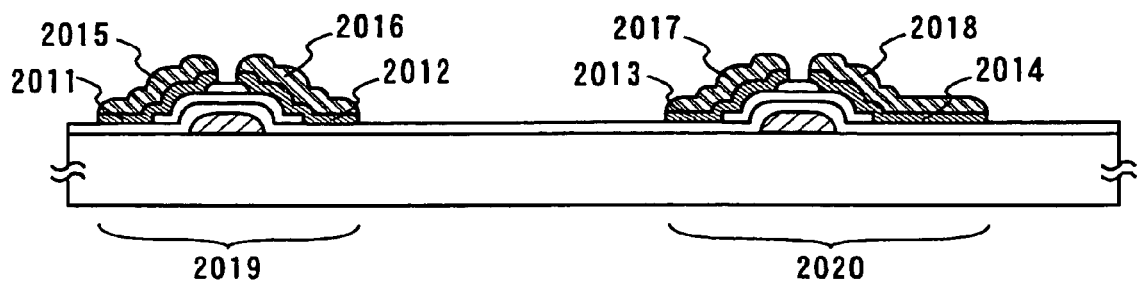
FIG. 15(A) to FIG. 15(C) are views which show one example of a method for manufacturing a semiconductor device of the invention.
Figure 15:
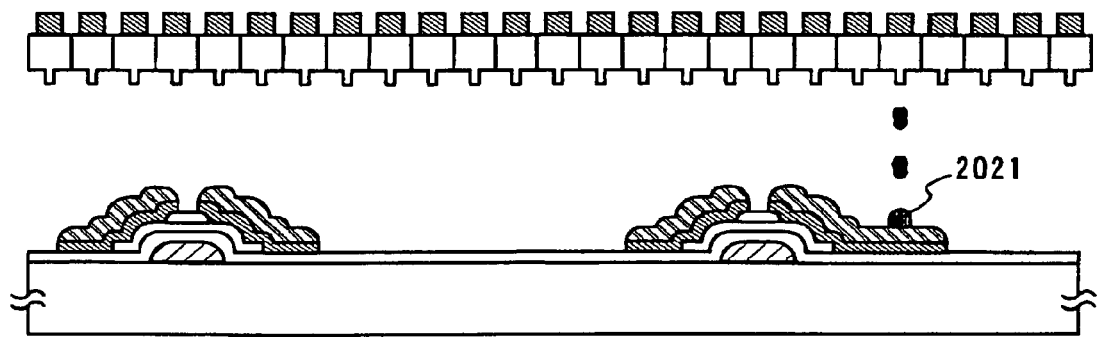
Figure 15:
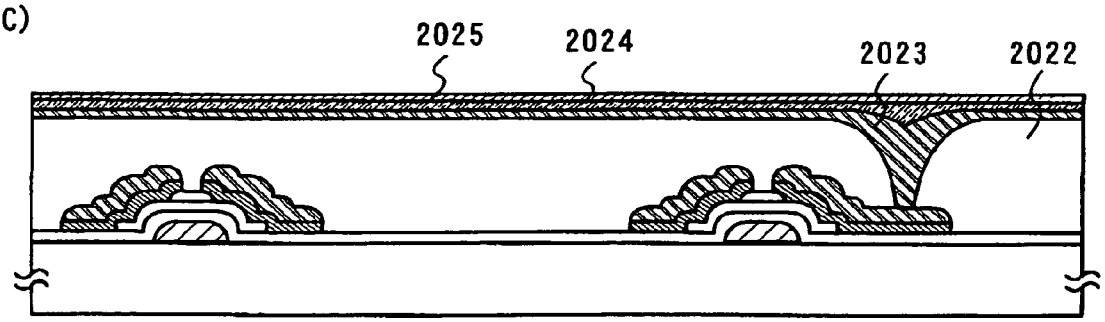

By the above-described processes, a switch TFT 2019, a drive TFT 2020 are formed (FIG. 15(A)).

Next, as shown in FIG. 15(B), before an interlayer insulating film is formed, an organic material 2021 having a liquid-shedding property is applied to a region in which a contact hole is formed, by use of a drop discharge method or a printing method etc. In this case, by removing the organic material 2021 having the liquid-shedding property, after an interlayer insulating film was formed, it is possible to form a contact hole without carrying out etching. In this embodiment, the organic material 2021 having the liquid-shedding property is applied by the drop discharge method. As the organic material having the liquid-shedding property, used is a silane coupling agent which is represented by a chemical formula of $R_n—Si—X_{(4-n)}$ (n=1, 2, 3). R is a thing which includes a relatively inactive group such as alkyl group, or a reactive group such as vinyl group, amino group or epoxy group. In addition, X is composed of a hydrolysis group which can be coupled by condensation with a hydroxyl group on a surface of the substrate such as halogen, methoxy group, ethoxy group or acetoxy group, or absorption water. In this embodiment mode, used is such a solution that fluoroalkyl silane (FAS) having a fluoro group, representatively, polytetrafluoroethylene (PTFE) was solved in n-octanol. In addition, it is possible to carry out removal of the organic material having the liquid-shedding property, by water cleaning, dry etching which used $CF_4$, $O_2$ etc.

Next, as shown in FIG. 15(C), an interlayer insulating film 2022 is formed. The interlayer insulating film 2022 can be formed by use of an organic resin film, an inorganic insulating film or a siloxane series insulating film. As the interlayer insulating film 2022, a material, which is called as a low dielectric constant material (low-k material), may be used.

Next, before an electric field light emitting layer 2024 is formed, in order to remove moisture and oxygen etc. which were absorbed in the interlayer insulating film 2022, heat treatment under barometric pressure atmosphere, or heat treatment (vacuum bake) under vacuum atmosphere may be carried out. Concretely speaking, heat treatment is carried out, with temperature of the substrate being 200° C. to 450° C., preferably 250° C. to 300° C., for a level of 0.5 to 20 hours, under vacuum atmosphere. Desirably, it is set to $3\times10^{-7}$ Torr or less, and if possible, it is the most desirable to set $3\times10^{-8}$ Torr or less. And, in case of film-forming an electric field light emitting layer after heat treatment was carried out under vacuum atmosphere, it is possible to more heighten reliability, by placing the substrate under vacuum atmosphere until just before the electric field light emitting layer is film-formed.

And, in a contact hole of the interlayer insulating film 2022, a first electrode 2023 is formed so as to be in contact with an electrode 2018 of the drive TFT 2020. In passing, in this embodiment, the first electrode 2023 corresponds to a cathode, and a second electrode 2025, which will be formed later, corresponds to an anode, but this invention is not limited to this configuration. The first electrode 2023 may correspond to the anode, and the second electrode 2025 may correspond to the cathode.

As the cathode, it is possible to use a metal with a small work function, an alloy, an electric conduction property compound, and a composite of these. Concretely speaking, it is possible to use a rare-earth metal such as Yb and Er, in addition to an alkali metal such as Li and Cs, and an alkaline-earth metal such as Mg, Ca, Sr, an alloy including these (Mg:Ag, Al:Li, Mg:In, etc.) and a compound of these ($CaF_2$, CaN). In addition, in case of disposing an electron injection layer, it is also possible to use another conductive layer such as Al. In addition, in case of taking out light from the cathode side, it is possible to use another translucent oxide conductive material such as indium tin oxide (ITO), zinc oxide (ZnO), indium zinc oxide (IZO), gallium added zinc oxide (GZO). Such a thing that zinc oxide (ZnO) of 2 to 20% was further mixed with indium tin oxide which includes ITO and silicon oxide (hereinafter, referred to as ITSO), and indium oxide which includes silicon oxide, may be used. In case of using a translucent oxide conductive material, it is desirable to dispose an electron injection layer in an electric field light emitting layer 2024 which will be formed later. In addition, it is possible to take out light from the cathode side, by forming a film thickness of such a level that light passes through the cathode (preferably, level of 5 nm to 30 nm), without using the translucent oxide conductive material. In this case, it may be designed to form a conductive layer having translucency, by use of the translucent oxide conductive material so as to be in contact with a upper part or a lower part of the cathode, and to suppress sheet resistance of the cathode.

In this embodiment mode, as the first electrode 2023 which corresponds to the anode, Mg:Ag is used. In passing, the first electrode 2023 can be formed by use of a sputtering method, a drop discharge method or a printing method. In case of using the drop discharge method or the printing method, it is possible to form the first electrode 2023 without using a mask. In addition, also in case of using the sputtering method, a resist, which is used in a lithography method, is formed by the drop discharge method and the printing method, and thereby, eliminated is a necessity to separately prepare a mask for light exposure, and thus, it is connected to reduction of a cost.

In passing, the first electrode 2023 may be cleaned and polished by a CMP method, a polyvinyl alcohol series porous body, so as for its surface to be planarized. In addition, after polishing by use of the CMP method, ultraviolet ray irradiation, oxygen plasma processing etc. are carried out to a surface of the cathode.

Next, the electric field light emitting layer 2024 is formed, so as to be in contact with the first electrode 2023. The electric field light emitting layer 2024 may be configured by a singular layer, or may be configured so as for plural layers to be laminated. In case that it is configured by plural layers, on the first electrode 2023 which corresponds to the cathode, an electron injection layer, an electron transport layer, a light emitting layer, a hole transport layer, a hole injection layer are laminated in sequence. In passing, in case that the first electrode 2023 corresponds to an anode, the electric field light emitting layer 2024 is formed by laminating a hole injection layer, a hole transport layer, a light emitting layer, an electron transport layer, an electron injection layer, in sequence.

In passing, it is possible to form the electric field light emitting layer 2024, by use of either of a high molecule series organic compound, a middle molecule series organic compound, a low molecule series organic compound, an inorganic compound, by the drop discharge method. In addition, the middle molecule series organic compound, the low molecule series organic compound, and the inorganic compound may be formed by a deposition method.

And, a second electrode 2025 is formed, so as to cover the electric field light emitting layer 2024. In this embodiment, the second electrode 2025 corresponds to an anode. It is preferable that, as a method for manufacturing the second electrode 2025, the deposition method, the sputtering method, the drop discharge method and so on are selectively used according to a material.

As the anode, it is possible to use another translucent oxide conductive material such as indium tin oxide (ITO), zinc oxide (ZnO), indium zinc oxide (IZO), gallium added zinc oxide (GZO). Such a thing that zinc oxide (ZnO) of 2 to 20% was further mixed with indium tin oxide which includes ITO and silicon oxide (hereinafter, referred to as ITSO), and indium oxide which includes silicon oxide, may be used. In addition, as the anode, in addition to the above-described translucent oxide conductive material, it is possible to use, in addition to a single layer film which is composed of one or a plurality of, for example, TiN, ZrN, Ti, W, Ni, Pt, Cr, Ag, Al etc., a laminated layer with a film which has titanium nitride and aluminum as principal components, and 3 layer configuration of a titanium nitride film, a film which has aluminum as a principal component, and a titanium nitride film, and so on. In this regard, however, in case of taking out light from the anode side by other material than the translucent oxide conductive material, it is formed with a film thickness of such a level that light passes through (preferably, level of 5 nm to 30 nm).

The first electrode 2023 and the electric field light emitting layer 2024 and the second electrode 2025 are overlapped, and thereby, a light emitting element is formed.

In passing, taking-out of light from the light emitting element may be from the first electrode 2023 side, or may be from the second electrode 2025 side, or may be from the both sides. Among the above-described 3 configurations, in tune with a configuration to be aimed, respective materials of the anode, the cathode, and a film thickness are to be selected. In case of taking out light from the second electrode 2025 side as in this implementation mode, as compared to a case of taking out light from the first electrode 2023 side, it is possible to obtain higher luminance with lower power consumption.

In FIGS. 14(A) to (C) and FIGS. 15(A) to (C), the first semiconductor film and the second semiconductor film are patterned by separate processes, but a semiconductor device of this invention is not limited to this manufacturing method.

In addition, the protective film is formed between the first semiconductor film and the second semiconductor film, but this invention is not limited to this configuration, and the protective film may not be necessarily formed.

In passing, this embodiment can be implemented with combination of the configuration which was described in another embodiment.

The invention claimed is:

1. A method for manufacturing a semiconductor device comprising:
   irradiating a substrate to be processed with a laser beam to form a groove in said substrate to be processed;
   discharging a drop from discharge means and landing the drop on said groove;
   evaporating a solvent of said drop;
   irradiating a solute of said drop with a laser beam to recrystallize, to form a gate electrode;
   forming a gate insulating film over the gate electrode; and
   forming a semiconductor film over the gate insulating film,
   wherein a width of said groove is wider than a diameter of said drop before landing on said groove, and
   wherein said groove is for accommodating said drop after it has landed in an inside of said groove.

2. A method for manufacturing a semiconductor device comprising:
   irradiating a substrate to be processed with a laser beam to form a groove in said substrate to be processed;
   discharging a drop from discharge means and landing the drop on said groove to form a gate electrode;
   forming a gate insulating film over the gate electrode; and
   forming a semiconductor film over the gate insulating film,
   wherein a width of said groove is wider than a diameter of said drop before landing on said groove, and
   wherein said groove is for accommodating said drop after it has landed in an inside of said groove.

3. A method for manufacturing a semiconductor device comprising:
   irradiating a surface to be processed with a laser beam to form a region including a plurality of convexity and concavity in said surface to be processed;
   discharging a drop from discharge means and landing the drop on said region including the plurality of convexity and concavity to form a gate electrode, the drop covering the plurality of convexity and concavity;
forming a gate insulating film over the gate electrode; and
forming a semiconductor film over the gate insulating film,
wherein the region including the plurality of convexity and concavity is for heightening adhesion with the drop.

4. A method for manufacturing a semiconductor device comprising:
irradiating a surface to be processed with a laser beam to form a region including a plurality of convexity and concavity in said surface to be processed;
discharging a drop from discharge means and landing said drop on said region including the plurality of convexity and concavity, so that the drop covers the plurality of convexity and concavity;
evaporating a solvent of said drop;
irradiating a solute of said drop with a laser beam to recrystallize, to form a gate electrode;
forming a gate insulating film over the gate electrode; and
forming a semiconductor film over the gate insulating film,
wherein the region including the plurality of convexity and concavity is for heightening adhesion with the drop.

5. A method for manufacturing a semiconductor device in any one of claim 1 through claim 4, wherein said laser beam is emitted from a gas laser oscillator, a solid-state laser oscillator, a metal laser oscillator, or a semiconductor laser oscillator.

6. A method for manufacturing a semiconductor device in any one of claim 1 though claim 4, wherein said drop is discharged under reduced pressure atmosphere.

7. A method for manufacturing a semiconductor device in any one of claim 1 though claim 4, wherein said drop is discharged under barometric pressure atmosphere.

8. A method for manufacturing a semiconductor device in any one of claim 1 through claim 4, wherein such time that said drop is landed, and such time that a surface to be processed is irradiated with said laser light are synchronized.

9. A method for manufacturing a semiconductor device comprising the step of:
irradiating a substrate to be processed with a laser beam to form a groove in said substrate to be processed;
discharging a drop from discharge means and landing the drop on said groove;
evaporating a solvent of said drop;
irradiating a solute of said drop with a laser beam to recrystallize, to form a gate electrode;
forming a gate insulating film over the gate electrode;
forming a semiconductor film over the ate insulating film;
forming a source or drain region over the semiconductor film; and
forming a wiring over the source or drain region by a drop discharge method,
wherein a width of said groove is wider than a diameter of said drop before landing on said groove, and
wherein said groove is for accommodating said drop after it has landed in an inside of said groove.

10. A method for manufacturing a semiconductor device comprising the step of:
irradiating a substrate to be processed with a laser beam to form a groove in said substrate to be processed;
discharging a drop from discharge means and landing the drop on said groove to form a gate electrode;
forming a gate insulating film over the ate electrode;
forming a semiconductor film over the gate insulating film;
forming a source or drain region over the semiconductor film; and
forming a wiring over the source or drain re ion b a drop discharge method,
wherein a width of said groove is wider than a diameter of said drop before landing on said groove, and
wherein said groove is for accommodating said drop after it has landed in an inside of said groove.

11. A method for manufacturing a semiconductor device comprising the step of:
irradiating a surface to be processed with a laser beam to form a region including a plurality of convexity and concavity in said surface to be processed;
discharging a drop from discharge means and landing the drop on said region including the plurality of convexity and concavity to form a gate electrode, the drop covering the plurality of convexity and concavity;
forming a gate insulating film over the gate electrode;
forming a semiconductor film over the gate insulating film;
forming a source or drain re ion over the semiconductor film; and
forming a wiring over the source or drain region by a drop discharge method,
wherein the region including the plurality of convexity and concavity is for heightening adhesion with the drop.

12. A method for manufacturing a semiconductor device comprising the step of:
irradiating a surface to be processed with a laser beam to form a region including a plurality of convexity and concavity in said surface to be processed;
discharging a drop from discharge means and landing said drop on said region including the plurality of convexity and concavity, so that the drop covers the plurality of convexity and concavity;
evaporating a solvent of said drop;
irradiating a solute of said drop with a laser beam to recrystallize, to form a gate electrode;
forming a ate insulating film over the ate electrode;
forming a semiconductor film over the gate insulating film;
forming a source or drain region over the semiconductor film; and
forming a wiring over the source or drain re ion b a drop discharge method,
wherein the region including the plurality of convexity and concavity is for heightening adhesion with the drop.

13. A method for manufacturing a semiconductor device according to any one of claim 9 through claim 12, wherein said laser beam is emitted from a gas laser oscillator, a solid-state laser oscillator, a metal laser oscillator, or a semiconductor laser oscillator.

14. A method for manufacturing a semiconductor device according to any one of claim 9 through claim 12, wherein said drop is discharged under reduced pressure atmosphere.

15. A method for manufacturing a semiconductor device according to any one of claim 9 through claim 12, wherein said drop is discharged under barometric pressure atmosphere.

16. A method for manufacturing a semiconductor device according to claim 12, wherein the solute of said drop is electrically conductive material, a resist material, a light emitting material, or semiconductor nano-particles.

17. A method for manufacturing a semiconductor device according to any one of claim 9 through claim 12, wherein such time that said drop is landed, and such time that a surface to be processed is irradiated with said laser light are synchronized.

18. A method for manufacturing a semiconductor device according to any one of claim 9 through claim 12, wherein said semiconductor device is used for an electronic equipment selected from a group consisting of a display device, a digital steam camera, a personal laptop computer, a mobile computer, a portable image reproduction device having a recording medium, a goggle type display, a video camera, and a cellular phone.

19. A method for manufacturing a semiconductor device according to claim 3 or 4, wherein the drop is one drop.

20. A method for manufacturing a semiconductor device according to claim 11 or 12, wherein the drop is one drop.

21. A method for manufacturing a semiconductor device according to claim 3 or 4, wherein the region including the plurality of convexity and concavity is of liquid-shedding to the drop.

22. A method for manufacturing a semiconductor device according to claim 11 or 12, wherein the region including the plurality of convexity and concavity is of liquid-shedding to the drop.

23. A method for manufacturing a semiconductor device according to claim 9, wherein the wiring is formed in the same manner as the gate electrode.

24. A method for manufacturing a semiconductor device according to claim 10, wherein the wiring is formed in the same manner as the gate electrode.

25. A method for manufacturing a semiconductor device according to claim 11, wherein the wiring is formed in the same manner as the gate electrode.

26. A method for manufacturing a semiconductor device according to claim 12, wherein the wiring is formed in the same manner as the gate electrode.

* * * * *

UNITED STATES PATENT AND TRADEMARK OFFICE
CERTIFICATE OF CORRECTION

| | |
|---|---|
| PATENT NO. | : 7,585,783 B2 |
| APPLICATION NO. | : 10/827710 |
| DATED | : September 8, 2009 |
| INVENTOR(S) | : Nakamura et al. |

Page 1 of 1

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by 477 days Delete the phrase "by 477 days" and insert -- by 629 days --

Signed and Sealed this

Twenty-seventh Day of April, 2010

David J. Kappos
*Director of the United States Patent and Trademark Office*